(12) United States Patent
Duparre

(10) Patent No.: US 8,514,491 B2
(45) Date of Patent: Aug. 20, 2013

(54) CAPTURING AND PROCESSING OF IMAGES USING MONOLITHIC CAMERA ARRAY WITH HETEROGENEOUS IMAGERS

(75) Inventor: Jacques Duparre, Jena (DE)

(73) Assignee: Pelican Imaging Corporation, Mountain View, CA (US)

( * ) Notice: Subject to any disclaimer, the term of this patent is extended or adjusted under 35 U.S.C. 154(b) by 104 days.

(21) Appl. No.: 12/952,106

(22) Filed: Nov. 22, 2010

(65) Prior Publication Data
US 2011/0122308 A1 May 26, 2011

Related U.S. Application Data

(60) Provisional application No. 61/281,662, filed on Nov. 20, 2009, provisional application No. 61/263,339, filed on Nov. 20, 2009.

(51) Int. Cl.
*G02B 27/10* (2006.01)
*G03B 21/56* (2006.01)

(52) U.S. Cl.
USPC .......................................... 359/618; 359/443

(58) Field of Classification Search
USPC ......... 359/618–621, 625–626, 443, 454–455; 264/1.1, 1.32, 2.7
See application file for complete search history.

(56) References Cited

U.S. PATENT DOCUMENTS

| | | | |
|---|---|---|---|
| 4,124,798 A | 11/1978 | Thompson | |
| 4,198,646 A | 4/1980 | Alexander et al. | |
| 4,460,449 A | 7/1984 | Montalbano | |
| 5,005,083 A | 4/1991 | Grage | |
| 5,808,350 A | 9/1998 | Jack et al. | |
| 5,832,312 A | 11/1998 | Rieger et al. | |
| 5,973,844 A * | 10/1999 | Burger .......................... 359/622 |
| 6,034,690 A | 3/2000 | Gallery et al. | |
| 6,137,535 A | 10/2000 | Meyers | |
| 6,141,048 A | 10/2000 | Meyers | |
| 6,603,513 B1 | 8/2003 | Berezin | |

(Continued)

FOREIGN PATENT DOCUMENTS

| | | |
|---|---|---|
| JP | 2011109484 A | 6/2011 |
| WO | 2011063347 A2 | 5/2011 |

(Continued)

OTHER PUBLICATIONS

Wikipedia, "Polarizing Filter (Photography)", printed from en.wikipedia.org/wiki/Polarizing_filter_(photography) Dec. 12, 2012, 5 pgs.

(Continued)

*Primary Examiner* — Dawayne A Pinkney
(74) *Attorney, Agent, or Firm* — KPPB LLP

(57) ABSTRACT

Systems and methods for implementing array cameras configured to perform super-resolution processing to generate higher resolution super-resolved images using a plurality of captured images and lens stack arrays that can be utilized in array cameras are disclosed. Lens stack arrays in accordance with many embodiments of the invention include lens elements formed on substrates separated by spacers, where the lens elements, substrates and spacers are configured to form a plurality of optical channels, at least one aperture located within each optical channel, at least one spectral filter located within each optical channel, where each spectral filter is configured to pass a specific spectral band of light, and light blocking materials located within the lens stack array to optically isolate the optical channels.

30 Claims, 18 Drawing Sheets

(56) References Cited

U.S. PATENT DOCUMENTS

| | | |
|---|---|---|
| 6,611,289 B1 | 8/2003 | Yu |
| 6,635,941 B2 | 10/2003 | Suda |
| 6,765,617 B1 | 7/2004 | Tangen et al. |
| 6,903,770 B1 | 6/2005 | Kobayashi et al. |
| 6,909,121 B2 | 6/2005 | Nishikawa |
| 6,958,862 B1 | 10/2005 | Joseph et al. |
| 7,085,409 B2 | 8/2006 | Sawhney et al. |
| 7,262,799 B2 | 8/2007 | Suda |
| 7,391,572 B2 | 6/2008 | Jacobowitz et al. |
| 7,723,662 B2 | 5/2010 | Levoy et al. |
| 8,027,531 B2 | 9/2011 | Wilburn et al. |
| 8,131,097 B2 | 3/2012 | Lelescu et al. |
| 8,231,814 B2 | 7/2012 | Duparre |
| 2002/0063807 A1 | 5/2002 | Margulis |
| 2002/0113867 A1* | 8/2002 | Takigawa et al. ............... 348/51 |
| 2002/0163054 A1* | 11/2002 | Suda ............... 257/431 |
| 2002/0177054 A1* | 11/2002 | Saitoh et al. .................... 430/22 |
| 2003/0124763 A1* | 7/2003 | Fan et al. ......................... 438/70 |
| 2003/0211405 A1 | 11/2003 | Venkataraman |
| 2004/0008271 A1 | 1/2004 | Hagimori et al. |
| 2004/0047274 A1* | 3/2004 | Amanai ........................ 369/125 |
| 2004/0050104 A1 | 3/2004 | Ghosh et al. |
| 2004/0234873 A1 | 11/2004 | Venkataraman |
| 2004/0251509 A1 | 12/2004 | Choi |
| 2005/0048690 A1 | 3/2005 | Yamamoto |
| 2005/0225654 A1 | 10/2005 | Feldman et al. |
| 2006/0038891 A1 | 2/2006 | Okutomi et al. |
| 2006/0054782 A1 | 3/2006 | Olsen et al. |
| 2006/0087747 A1 | 4/2006 | Ohzawa et al. |
| 2006/0138322 A1 | 6/2006 | Costello et al. |
| 2006/0159369 A1 | 7/2006 | Young |
| 2006/0176566 A1* | 8/2006 | Boettiger et al. ............. 359/619 |
| 2006/0187338 A1 | 8/2006 | May et al. |
| 2006/0251410 A1 | 11/2006 | Trutna |
| 2007/0002159 A1 | 1/2007 | Olsen et al. |
| 2007/0041391 A1 | 2/2007 | Lin et al. |
| 2007/0083114 A1 | 4/2007 | Yang et al. |
| 2007/0102622 A1 | 5/2007 | Olsen et al. |
| 2007/0127831 A1 | 6/2007 | Venkataraman |
| 2007/0139333 A1 | 6/2007 | Sato et al. |
| 2007/0211164 A1 | 9/2007 | Olsen et al. |
| 2007/0216765 A1 | 9/2007 | Wong et al. |
| 2007/0257184 A1 | 11/2007 | Olsen et al. |
| 2007/0258006 A1 | 11/2007 | Olsen et al. |
| 2007/0296835 A1 | 12/2007 | Olsen et al. |
| 2008/0043096 A1 | 2/2008 | Vetro et al. |
| 2008/0080028 A1 | 4/2008 | Bakin et al. |
| 2008/0088793 A1 | 4/2008 | Sverdrup et al. |
| 2008/0118241 A1 | 5/2008 | Tekolste et al. |
| 2008/0247638 A1 | 10/2008 | Tanida et al. |
| 2008/0247653 A1 | 10/2008 | Moussavi et al. |
| 2009/0050946 A1 | 2/2009 | Duparre et al. |
| 2009/0060281 A1 | 3/2009 | Tanida et al. |
| 2009/0102956 A1 | 4/2009 | Georgiev |
| 2009/0179142 A1 | 7/2009 | Duparre et al. |
| 2009/0200622 A1 | 8/2009 | Tai et al. |
| 2009/0225203 A1 | 9/2009 | Tanida et al. |
| 2009/0268192 A1 | 10/2009 | Koenck et al. |
| 2009/0302205 A9 | 12/2009 | Olsen et al. |
| 2009/0323195 A1 | 12/2009 | Hembree et al. |
| 2010/0002313 A1 | 1/2010 | Duparre et al. |
| 2010/0002314 A1 | 1/2010 | Duparre |
| 2010/0053600 A1 | 3/2010 | Tanida et al. |
| 2010/0060746 A9 | 3/2010 | Olsen et al. |
| 2010/0097491 A1 | 4/2010 | Farina et al. |
| 2010/0103259 A1 | 4/2010 | Tanida et al. |
| 2010/0177411 A1 | 7/2010 | Hegde et al. |
| 2010/0201834 A1 | 8/2010 | Maruyama et al. |
| 2010/0244165 A1 | 9/2010 | Lake et al. |
| 2011/0069189 A1 | 3/2011 | Venkataraman et al. |
| 2011/0080487 A1 | 4/2011 | Venkataraman et al. |
| 2011/0122308 A1 | 5/2011 | Duparre |
| 2011/0211824 A1 | 9/2011 | Georgiev et al. |
| 2011/0241234 A1 | 10/2011 | Duparre |
| 2012/0198677 A1 | 8/2012 | Duparre |
| 2013/0003184 A1 | 1/2013 | Duparre |
| 2013/0088637 A1 | 4/2013 | Duparre |

FOREIGN PATENT DOCUMENTS

| | | |
|---|---|---|
| WO | 2011116203 A1 | 9/2011 |
| WO | 2011/063347 A3 | 10/2011 |
| WO | 2011063347 A3 | 10/2011 |
| WO | 2012057619 A1 | 5/2012 |
| WO | 2012057620 A2 | 5/2012 |
| WO | 2013003276 A1 | 1/2013 |
| WO | 2013043751 A1 | 3/2013 |
| WO | 2013055960 A1 | 4/2013 |

OTHER PUBLICATIONS

International Search Report and Written Opinion for International Application PCT/US2010/057661, completed Mar. 9, 2011, 14 pgs.

International Search Report and Written Opinion for International Application PCT/US2009/044687, completed Jan. 5, 2010, 13 pgs.

Bruckner et al., "Artificial compound eye applying hyperacuity", Optics Express, Dec. 11, 2006, vol. 14, No. 25, pp. 12076-12084.

Bruckner et al., "Driving microoptical imaging systems towards miniature camera applications", Proc. SPIE, Micro-Optics, 2010, 11 pgs.

Bruckner et al., "Thin wafer-level camera lenses inspired by insect compound eyes", Optics Express, Nov. 22, 2010, vol. 18, No. 24, pp. 24379-24394.

Chan et al., "Extending the Depth of Field in a Compound-Eye Imaging System with Super-Resolution Reconstruction", Proceedings—International Conference on Pattern Recognition, 2006, vol. 3, pp. 623-626.

Chan et al., "Investigation of Computational Compound-Eye Imaging System with Super-Resolution Reconstruction", IEEE, ISASSP 2006, pp. 1177-1180.

Chan et al., "Super-resolution reconstruction in a computational compound-eye imaging system", Multidim. Syst. Sign Process, 2007, vol. 18, pp. 83-101.

Duparre et al., "Artificial apposition compound eye fabricated by micro-optics technology", Applied Optics, Aug. 1, 2004, vol. 43, No. 22, pp. 4303-4310.

Duparre et al., "Artificial compound eye zoom camera", Bioinspiration & Biomimetics, 2008, vol. 3, pp. 1-6.

Duparre et al., "Artificial compound eyes—different concepts and their application to ultra flat image acquisition sensors", MOEMS and Miniaturized Systems IV, Proc. SPIE 5346, Jan. 2004, pp. 89-100.

Duparre et al., "Chirped arrays of refractive ellipsoidal microlenses for aberration correction under oblique incidence", Optics Express, Dec. 26, 2005, vol. 13, No. 26, pp. 10539-10551.

Duparre et al., "Micro-optical artificial compound eyes", Bioinspiration & Biomimetics, 2006, vol. 1, pp. R1-R16.

Duparre et al., "Microoptical artificial compound eyes—from design to experimental verification of two different concepts", Proc. of SPIE, Optical Design and Engineering II, vol. 5962, pp. 59622A-1-9622A-12.

Duparre et al., "Microoptical Artificial Compound Eyes—Two Different Concepts for Compact Imaging Systems", 11th Microoptics Conference, Oct. 30-Nov. 2, 2005, 2 pgs.

Duparre et al., "Microoptical telescope compound eye", Optics Express, Feb. 7, 2005, vol. 13, No. 3, pp. 889-903.

Duparre et al., "Micro-optically fabricated artificial apposition compound eye", Electronic Imaging—Science and Technology, Prod. SPIE 5301, Jan. 2004, pp. 25-33.

Duparre et al., "Novel Optics/Micro-Optics for Miniature Imaging Systems", Proc. of SPIE, 2006, vol. 6196, pp. 619607-1-619607-15.

Duparre et al., "Theoretical analysis of an artificial superposition compound eye for application in ultra flat digital image acquisition devices", Optical Systems Design, Proc. SPIE 5249, Sep. 2003, pp. 408-418.

Duparre et al., "Thin compound-eye camera", Applied Optics, May 20, 3005, vol. 44, No. 15, pp. 2949-2956.

Duparre et al., "Ultra-Thin Camera Based on Artificial Apposition Compound Eyes", 10th Microoptics Conference, Sep. 1-3, 2004, 2 pgs.

Fife et al., "A 3D Multi-Aperture Image Sensor Architecture", Custom Integrated Circuits Conference, 2006, CICC '06, IEEE, pp. 281-284.

Fife et al., "A 3MPixel Multi-Aperture Image Sensor with 0.7Mu Pixels in 0.11Mu CMOS", ISSCC 2008, Session 2, Image Sensors & Technology, 2008, pp. 48-50.

Horisaki et al., "Irregular Lens Arrangement Design to Improve Imaging Performance of Compound-Eye Imaging Systems", Applied Physics Express, 2010, vol. 3, pp. 022501-1-022501-3.

Horisaki et al., "Superposition Imaging for Three-Dimensionally Space-Invariant Point Spread Functions", Applied Physics Express, 2011, vol. 4, pp. 112501-1-112501-3.

Kitamura et al., "Reconstruction of a high-resolution image on a compound-eye image-capturing system", Applied Optics, Mar. 10, 2004, vol. 43, No. 8, pp. 1719-1727.

Levoy, "Light Fields and Computational Imaging", IEEE Computer Society, Aug. 2006, pp. 46-55.

Levoy et al., "Light Field Rendering", Proc. ADM Siggraph '96, pp. 1-12.

Nitta et al., "Image reconstruction for thin observation module by bound optics by using the iterative backprojection method", Applied Optics, May 1, 2006, vol. 45, No. 13, pp. 2893-2900.

Radtke et al., "Laser lithographic fabrication and characterization of a spherical artificial compound eye", Optics Express, Mar. 19, 2007, vol. 15, No. 6, pp. 3067-3077.

Stollberg et al., "The Gabor superlens as an alternative wafer-level camera approach inspired by superposition compound eyes of nocturnal insects", Optics Express, Aug. 31, 2009, vol. 17, No. 18, pp. 15747-15759.

Tanida et al., "Color imaging with an integrated compound imaging system", Optics Express, Sep. 8, 2003, vol. 11, No. 18, pp. 2109-2117.

Tanida et al., "Thin observation module by bound optics (TOMBO): concept and experimental verification", Applied Optics, Apr. 10, 2001, vol. 40, No. 11, pp. 1806-1813.

Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.

Vaish et al., "Synthetic Aperture Focusing Using a Shear-Warp Factorization of the Viewing Transform", IEEE Workshop on A3DISS, CVPR, 2005, 8 pgs.

Vaish et al., "Using Plane+ Parallax for Calibrating Dense Camera Arrays", IEEE Conference on Computer Vision and Pattern Recognition (CVPR), 2004, 8 pgs.

Wilburn, "High Performance Imaging Using Arrays of Inexpensive Cameras", Thesis of Bennett Wilburn, Dec. 2004, 128 pgs.

Wilburn et al., "High Performance Imaging Using Large Camera Arrays", ACM Transactions on Graphics, Jul. 2005, vol. 24, No. 3, pp. 765-776.

Wilburn et al., "High-Speed Videography Using a Dense Camera Array", Proceeding, CVPR'04 Proceedings of the 2004 IEEE Computer Society Conference on Computer Vision and Pattern Recognition, pp. 294-301.

Wilburn et al., "The Light Field Video Camera", Proceedings of Media Processors 2002, SPIE Electronic Imaging, 2002, 8 pgs.

Wippermann et al., "Design and fabrication of a chirped array of refractive ellipsoidal micro-lenses for an appostion eye camera objective", Proceedings of SPIE, Optical Design and Engineering II, Oct. 15, 2005, 59622C-1-59622C-11.

International Search Report and Written Opinion for International Application PCT/US2012/056151, completed Nov. 14, 2012, 10 pgs.

Bose et al., "Superresolution and Noise Filtering Using Moving Least Squares", IEEE Transactions on Image Processing, date unknown, 21 pgs.

Hardie, "A Fast Image Super-Algorithm Using an Adaptive Wiener Filter", IEEE Transactions on Image Processing, Dec. 2007, vol. 16, No. 12, pp. 2953-2964.

LensVector, "How LensVector Autofocus Works", http://www.lensvector.com/overview.html.

Nayar, "Computational Cameras: Redefining the Image", IEEE Computer Society, Aug. 2006, pp. 30-38.

Pham et al., "Robust Super-Resolution without Regularization", Journal of Physics: Conference Series 124, 2008, pp. 1-19.

Polight, "Designing Imaging Products Using Reflowable Autofocus Lenses", http://www.polight.no/tunable-polymer-autofocus-lens-html--11.html.

Protter et al., "Generalizing the Nonlocal-Means to Super-Resolution Reconstruction", IEEE Transactions on Image Processing, Jan. 2009, vol. 18, No. 1, pp. 36-51.

Sun et al., "Image Super-Resolution Using Gradient Profile Prior", Source and date unknown, 8 pgs.

Takeda et al., "Super-resolution Without Explicit Subpixel Motion Estimation", IEEE Transaction on Image Processing, Sep. 2009, vol. 18, No. 9, pp. 1958-1975.

Wang, "Calculation of Image Position, Size and Orientation Using First Order Properties".

Wetzstein et al., "Computational Plenoptic Imaging", Computer Graphics Forum, 2011, vol. 30, No. 8, pp. 2397-2426.

Yang et al., "Superresolution Using Preconditioned Conjugate Gradient Method", Source and date unknown, 8 pgs.

Zomet et al., "Robust Super-Resolution", IEEE, 2001, pp. 1-6.

Baker et al., "Limits on Super-Resolution and How to Break Them", IEEE Transactions on Pattern Analysis and Machine Intelligence, Sep. 2002, vol. 24, No. 9, pp. 1167-1183.

Bertero et al., "Super-resolution in computational imaging", Micron, 2003, vol. 34, Issues 6-7, 17 pgs.

Borman, "Topics in Multiframe Superresolution Restoration", Thesis of Sean Borman, Apr. 2004, 282 pgs.

Borman et al, "Image Sequence Processing", Source unknown, Oct. 14, 2002, 81 pgs.

Borman et al., "Block-Matching Sub-Pixel Motion Estimation from Noisy, Under-Sampled Frames—An Empirical Performance Evaluation", Proc SPIE, Dec. 1998, 3653, 10 pgs.

Borman et al., "Image Resampling and Constraint Formulation for Multi-Frame Super-Resolution Restoration", Proc. SPIE, Jun. 2003, 5016, 12 pgs.

Borman et al., "Linear models for multi-frame super-resolution restoration under non-affine registration and spatially varying PSF", Proc. SPIE, May 2004, vol. 5299, 12 pgs.

Borman et al., "Nonlinear Prediction Methods for Estimation of Clique Weighting Parameters in NonGaussian Image Models", Proc. SPIE, 1998. 3459, 9 pgs.

Borman et al., "Simultaneous Multi-Frame MAP Super-Resolution Video Enhancement Using Spatio-Temporal Priors", Image Processing, 1999, ICIP 99 Proceedings, vol. 3, pp. 469-473.

Borman et al., "Super-Resolution from Image Sequences—A Review", Circuits & Systems, 1998, pp. 374-378.

Boye et al., "Comparison of Subpixel Image Registration Algorithms", Proc. of SPIE-IS&T Electronic Imaging, vol. 7246, pp. 72460X-1-72460X-9.

Drouin et al., "Fast Multiple-Baseline Stereo with Occlusion", Proceedings of the Fifth International Conference on 3-D Digital Imaging and Modeling, 2005, 8 pgs.

Drouin et al., "Geo-Consistency for Wide Multi-Camera Stereo", Proceedings of the 2005 IEEE Computer Society Conference on Computer Vision and Pattern Recognition, 2005, 8 pgs.

Drouin et al., "Improving Border Localization of Multi-Baseline Stereo Using Border-Cut", International Journal of Computer Vision, Jul. 2009, vol. 83, Issue 3, 8 pgs.

Farrell et al., "Resolution and Light Sensitivity Tradeoff with Pixel Size", Proceedings of the SPIE Electronic Imaging 2006 Conference, 2006, vol. 6069, 8 pgs.

Farsiu et al., "Advances and Challenges in Super-Resolution", International Journal of Imaging Systems and Technology, 2004, vol. 14, pp. 47-57.

Farsiu et al., "Fast and Robust Multiframe Super Resolution", IEEE Transactions on Image Processing, Oct. 2004, vol. 13, No. 10, pp. 1327-1344.

Farsiu et al., "Multiframe Demosaicing and Super-Resolution of Color Images", IEEE Transactions on Image Processing, Jan. 2006, vol. 15, No. 1, pp. 141-159.

Feris et al., "Multi-Flash Stereopsis: Depth Edge Preserving Stereo with Small Baseline Illumination", IEEE Trans on PAMI, 2006, 31 pgs.

Kang et al., "Handling Occlusions inn Dense Multi-View Stereo", Computer Vision and Pattern Recognition, 2001, vol. 1, pp. I-103-I-110.

Krishnamurthy et al., "Compression and Transmission of Depth Maps for Image-Based Rendering", Image Processing, 2001, pp. 838-831.

Kutulakos et al., "Occluding Contour Detection Using Affine Invariants and Purposive Viewpoint Control", Proc., CVPR 94, 8 pgs.

Liu et al., "Virtual View Reconstruction Using Temporal Information", 2012 IEEE International Conference on Multimedia and Expo, 2012, pp. 115-120.

Ng, "Digital Light Field Photography", Thesis, Jul. 2006, 203 pgs.

Ng et al., "Super-Resolution Image Restoration from Blurred Low-Resolution Images", Journal of Mathematical Imaging and Vision, 2005, vol. 23, pp. 367-378.

Park et al., "Super-Resolution Image Reconstruction", IEEE Signal Processing Magazine, May 2003, pp. 21-36.

Rhemann et al, "Fast Cost-Volume Filtering for Visual Correspondence and Beyond", IEEE Trans. Pattern Anal. Mach. Intell, 2013, vol. 35, No. 2, pp. 504-511.

Robertson et al., "Dynamic Range Improvement Through Multiple Exposures", In Proc. of the Int. Conf. on Image Processing, 1999, 5 pgs.

Robertson et al., "Estimation-theoretic approach to dynamic range enhancement using multiple exposures", Journal of Electronic Imaging, Apr. 2003, vol. 12, No. 2, pp. 219-228.

Roy et al., "Non-Uniform Hierarchical Pyramid Stereo for Large Images", Computer and Robot Vision, 2007, pp. 208-215.

Sauer et al., "Parallel Computation of Sequential Pixel Updates in Statistical Tomographic Reconstruction", ICIP 1995, pp. 93-96.

Wheeler et al., "Super-Resolution Image Synthesis Using Projections Onto Convex Sets in the Frequency Domain", Proc. SPIE, 2005, 5674, 12 pgs.

\* cited by examiner

CAPTURING AND PROCESSING OF IMAGES USING MONOLITHIC CAMERA ARRAY WITH HETEROGENEOUS IMAGERS

RELATED APPLICATIONS

This application claims priority to U.S. Provisional Patent Application 61/281,662 filed Nov. 20, 2009 and U.S. Provisional Patent Application 61/263,339 filed Nov. 20, 2009, the disclosure of which is incorporated by reference herein in its entirety.

FIELD OF THE INVENTION

The present invention is related to an image sensor including a plurality of heterogeneous imagers, more specifically to an image sensor with a plurality of wafer-level imagers having custom filters, sensors and optics of varying configurations.

BACKGROUND

Image sensors are used in cameras and other imaging devices to capture images. In a typical imaging device, light enters through an opening (aperture) at one end of the imaging device and is directed to an image sensor by an optical element such as a lens. In most imaging devices, one or more layers of optical elements are placed between the aperture and the image sensor to focus light onto the image sensor. The image sensor consists of pixels that generate signals upon receiving light via the optical element. Commonly used image sensors include CCD (charge-coupled device) image sensors and CMOS (complementary metal-oxide-semiconductor) sensors.

Filters are often employed in the image sensor to selectively transmit lights of certain wavelengths onto pixels. A Bayer filter mosaic is often formed on the image sensor. The Bayer filter is a color filter array that arranges one of the RGB color filters on each of the color pixels. The Bayer filter pattern includes 50% green filters, 25% red filters and 25% blue filters. Since each pixel generates a signal representing strength of a color component in the light and not the full range of colors, demosaicing is performed to interpolate a set of red, green and blue values for each image pixel.

The image sensors are subject to various performance constraints. The performance constraints for the image sensors include, among others, dynamic range, signal to noise (SNR) ratio and low light sensitivity. The dynamic range is defined as the ratio of the maximum possible signal that can be captured by a pixel to the total noise signal. Typically, the well capacity of an image sensor limits the maximum possible signal that can be captured by the image sensor. The maximum possible signal in turn is dependent on the strength of the incident illumination and the duration of exposure (e.g., integration time, and shutter width). The dynamic range can be expressed as a dimensionless quantity in decibels (dB) as:

$$DR = \frac{\text{full well capacity}}{\text{RMS noise}} \quad \text{equation (1)}$$

Typically, the noise level in the captured image influences the floor of the dynamic range. Thus, for an 8 bit image, the best case would be 48 dB assuming the RMS noise level is 1 bit. In reality, however, the RMS noise levels are higher than 1 bit, and this further reduces the dynamic range.

The signal to noise ratio (SNR) of a captured image is, to a great extent, a measure of image quality. In general, as more light is captured by the pixel, the higher the SNR. The SNR of a captured image is usually related to the light gathering capability of the pixel.

Generally, Bayer filter sensors have low light sensitivity. At low light levels, each pixel's light gathering capability is constrained by the low signal levels incident upon each pixel. In addition, the color filters over the pixel further constrain the signal reaching the pixel. IR (Infrared) filters also reduce the photo-response from near-IR signals, which can carry valuable information.

These performance constraints of image sensors are greatly magnified in cameras designed for mobile systems due to the nature of design constraints. Pixels for mobile cameras are typically much smaller than the pixels of digital still cameras (DSC). Due to limits in light gathering ability, reduced SNR, limits in the dynamic range, and reduced sensitivity to low light scenes, the cameras in mobile cameras show poor performance.

SUMMARY

Lens stack arrays that can be utilized in camera arrays in accordance with embodiments of the invention are disclosed. In many embodiments, lens elements are provided that can direct and focus light onto the imagers of a camera array. The lens elements form lens stacks that create optical channels, and each lens stack focuses light onto one imager. Because each lens element is associated with one imager, each lens element may be designed and configured for a narrow light spectrum. Further, the thickness of the lens element may be reduced, decreasing the overall thickness of the camera array. In such an embodiment, the lens elements may be made using any suitable fabrication technique, such as, for example using wafer level optics (WLO) technology, injection molding, and/or glass molding.

A lens stack array in accordance with another embodiment of the invention includes lens elements formed on substrates separated by spacers, where the lens elements, substrates and spacers are configured to form a plurality of optical channels, at least one aperture located within each optical channel, at least one spectral filter located within each optical channel, where each spectral filter is configured to pass a specific spectral band of light, and light blocking materials located within the lens stack array to optically isolate the optical channels.

In a further embodiment, the light blocking materials are selected from the group consisting of opaque materials, reflective materials and combinations thereof.

In another embodiment, spectral filters that pass different spectral bands are provided within at least two of the imagers.

In a still further embodiment, each spectral filter is selected from the group consisting of an organic color filter, an absorptive material, a dielectric coating, an interference filter, a multilayer coating, and combinations thereof.

Still another embodiment also includes at least one polarizing filter located within each optical channel.

In a yet further embodiment, the construction of each optical channel differs based upon the specific spectral band of light passed by the spectral filter within the imager so that chromatic aberrations are reduced.

In yet another embodiment, the prescription of at least one surface of a lens within each optical channel is a function of the specific spectral band of light passed by the spectral filter within the optical channel.

In a further embodiment again, the back focal lengths of each optical channel in the lens stack array are the same irrespective of the spectral band of light passed by the spectral filter within the optical channel.

In another embodiment again, a combination of high and low Abbe number materials is used in the construction of each of the lens elements in an optical channel to reduce chromatic aberrations.

A further additional embodiment also includes at least one aperture stop located within each optical channel. In addition, each spectral filter is located within each optical channel so that the spectral filter is proximate the aperture stop.

In another additional embodiment, each aperture stop is formed by a light blocking material selected from the group consisting of metal materials, oxide materials, black particle filled photoresists and combinations thereof.

In a still yet further embodiment, the at least one lens surface of a lens in each optical channel differs based upon the specific spectral band of light passed by the spectral filter within the optical channel, and each lens surface is selected from the group consisting of diffractive, Fresnel, refractive and combinations thereof.

In still yet another embodiment, the radii of curvature of the lens surfaces differ based upon the specific spectral band of light passed by the spectral filter within the optical channel.

In a still further embodiment again, each of the optical channels have the same back focal length.

In still another embodiment again, at least one of the lens elements in an optical channel is a negative lens element, and the negative lens element is proximate the image formed by the optical channel.

In a still further additional embodiment, at least two of the optical channels have different focal lengths.

Still another additional embodiment also includes a mechanical zoom mechanism within an optical channel configured to smoothly transition between different fields of view.

In a yet further embodiment again, the lens stack array comprises an N×M array of optical channels, where at least one of N and M is greater than 2.

In yet another embodiment again, the lens stack array is fabricated using techniques consisting of wafer level optics techniques, injection molding, glass molding and combinations thereof.

In a yet further additional embodiment, the light blocking materials located within the lens stack array to optically separate the optical channels comprise at least two opaque surfaces located on a substrate within an optical channel, where the two opaque surfaces have openings arranged in axial alignment with the optical channel.

In yet another additional embodiment, the light blocking materials located within the lens stack array to optically separate the optical channels comprise opaque walls disposed at the boundaries between the optical channels.

In a still further additional embodiment again, the opaque walls are cavities between the optical channels filled with light blocking material.

In still another additional embodiment again, a plurality of the spacers are constructed from light blocking materials and are located within the lens stack array to optically separate the optical channels.

In a yet further additional embodiment again, a plurality of the spacers are coated in light blocking materials and are located within the lens stack array to optically isolate the optical channels.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION

Embodiments of the invention are now described with reference to the figures where like reference numbers indicate identical or functionally similar elements. Also in the figures, the left most digits of each reference number corresponds to the figure in which the reference number is first used.

Many embodiments relate to using a distributed approach to capturing images using a plurality of imagers of different imaging characteristics. Each imager may be configured in such a manner that each imager captures an image that is shifted by a sub-pixel amount with respect to the image captured by other imagers having similar imaging characteristics. Each imager may also include separate optics with different filters and operate with different operating parameters (e.g., exposure time). Distinct images generated by the imagers are processed to obtain an enhanced image. In many embodiments, the separate optics incorporated into each imager are implemented using a lens stack array. The lens stack array can include one or more optical elements fabricated using wafer level optics (WLO) technology.

A sensor element or pixel refers to an individual light sensing element in an imager. The light sensing element can be, but is not limited to, traditional CIS (CMOS Image Sensor), CCD (charge-coupled device), high dynamic range pixel, multispectral pixel and various alternatives thereof.

A sensor refers to a two dimensional array of pixels used to capture an image formed on the sensor by the optics of the imager. The sensor elements of each sensor have similar physical properties and receive light through the same optical component. Further, the sensor elements in the each sensor may be associated with the same color filter.

A camera array refers to a collection of imagers designed to function as a unitary component. The camera array may be fabricated on a single chip for mounting or installing in various devices.

An array of camera arrays refers to an aggregation of two or more camera arrays. Two or more camera arrays may operate in conjunction to provide extended functionality over a single camera array, such as, for example, stereo resolution.

Image characteristics of an imager refer to any characteristics or parameters of the imager associated with capturing of images. The imaging characteristics may include, among others, the size of the imager, the type of pixels included in the imager, the shape of the imager, filters associated with the imager, the exposure time of the imager, aperture size associated with the imager, the configuration of the optical element associated with the imager (such as the number of elements, the shapes, profiles and sizes of the lens surfaces, including the radii of curvature, aspheric coefficients, focal lengths and FOVs of the objectives, color correction, F/#s, etc.), the gain of the imager, the resolution of the imager, and operational timing of the imager.

Structure of Camera Array

Figure 1:
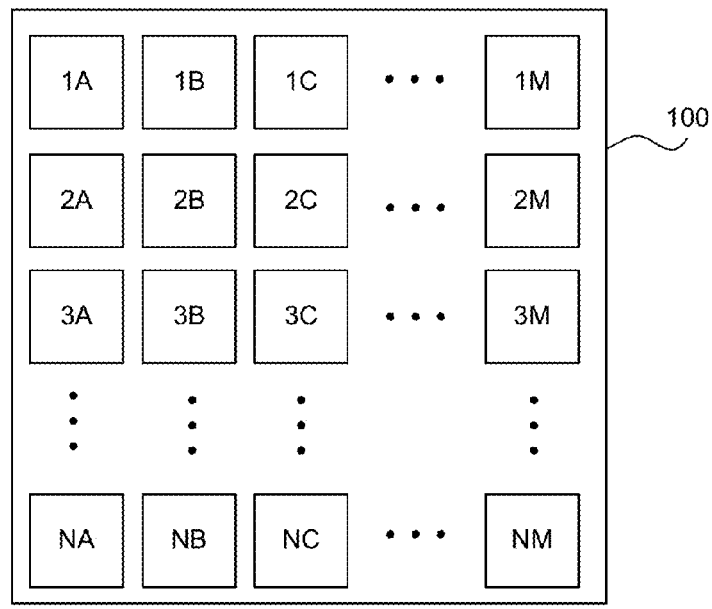
FIG. 1 is a plan view of a camera array with a plurality of imagers, according to one embodiment.

FIG. 1 is a plan view of a camera array 100 with imagers 1A through NM, according to one embodiment. The camera array 100 is fabricated on a semiconductor chip to include a plurality of imagers 1A through NM. Each of the imagers 1A through NM may include a plurality of pixels (e.g., 0.32 Mega pixels). In one embodiment, the imagers 1A through NM are arranged into a grid format as illustrated in FIG. 1. In other embodiments, the imagers are arranged in a non-grid format. For example, the imagers may be arranged in a circular pattern, zigzagged pattern or scattered pattern or an irregular pattern including sub-pixel offsets.

The camera array may include two or more types of heterogeneous imagers, each imager including two or more sensor elements or pixels. Each one of the imagers may have different imaging characteristics. Alternatively, there may be two or more different types of imagers where the same type of imager shares the same imaging characteristics.

In one embodiment, each imager 1A through NM has its own filter and/or optical element (e.g., lens). Specifically, each of the imagers 1A through NM or a group of imagers may be associated with spectral color filters to receive certain wavelengths of light. Example filters include a traditional filter used in the Bayer pattern (R, G, B or their complements C, M, Y), an IR-cut filter, a near-IR filter, a polarizing filter, and a custom filter to suit the needs of hyper-spectral imaging. Some imagers may have no filter to allow reception of both the entire visible spectra and near-IR, which increases the imager's signal-to-noise ratio. The number of distinct filters may be as large as the number of imagers in the camera array. Further, each of the imagers 1A through NM or a group of imagers may receive light through lenses having different optical characteristics (e.g., focal lengths) or apertures of different sizes.

In one embodiment, the camera array includes other related circuitry. The other circuitry may include, among others, circuitry to control imaging parameters and sensors to sense physical parameters. The control circuitry may control imaging parameters such as exposure times, gain, and black level offset. The sensor may include dark pixels to estimate dark current at the operating temperature. The dark current may be measured for on-the-fly compensation for any thermal creep that the substrate may suffer from. Alternatively, compensation of thermal effects associated with the optics, e.g., because of changes in refractive index of the lens material, may be accomplished by calibrating the PSF for different temperatures.

In one embodiment, the circuit for controlling imaging parameters may trigger each imager independently or in a synchronized manner. The start of the exposure periods for the various imagers in the camera array (analogous to opening a shutter) may be staggered in an overlapping manner so that the scenes are sampled sequentially while having several imagers being exposed to light at the same time. In a conventional video camera sampling a scene at N exposures per second, the exposure time per sample is limited to 1/N seconds. With a plurality of imagers, there is no such limit to the exposure time per sample because multiple imagers may be operated to capture images in a staggered manner.

Each imager can be operated independently. Entire or most operations associated with each individual imager may be individualized. In one embodiment, a master setting is programmed and deviation (i.e., offset or gain) from such master setting is configured for each imager. The deviations may reflect functions such as high dynamic range, gain settings, integration time settings, digital processing settings or combinations thereof. These deviations can be specified at a low level (e.g., deviation in the gain) or at a higher level (e.g., difference in the ISO number, which is then automatically translated to deltas for gain, integration time, or otherwise as specified by context/master control registers) for the particular camera array. By setting the master values and deviations from the master values, higher levels of control abstraction can be achieved to facilitate a simpler programming model for many operations. In one embodiment, the parameters for the imagers are arbitrarily fixed for a target application. In another embodiment, the parameters are configured to allow a high degree of flexibility and programmability.

In one embodiment, the camera array is designed as a drop-in replacement for existing camera image sensors used in cell phones and other mobile devices. For this purpose, the camera array may be designed to be physically compatible with conventional image sensors of approximately the same resolution although the achieved resolution of the camera array may exceed conventional image sensors in many photographic situations. Taking advantage of the increased performance, the camera array in accordance with embodiments of the invention may include fewer pixels to obtain equal or better quality images compared to conventional image sensors. Alternatively, the size of the pixels in the imager may be reduced compared to pixels in conventional image sensors while achieving comparable results.

In order to match the raw pixel count of a conventional image sensor without increasing silicon area, the logic overhead for the individual imagers is preferably constrained in the silicon area. In one embodiment, much of the pixel control logic is a single collection of functions common to all or most of the imagers with a smaller set of functions applicable to each imager. In this embodiment, the conventional external interface for the imager may be used because the data output does not increase significantly for the imagers.

In one embodiment, the camera array including the imagers replaces a conventional image sensor of M megapixels. The camera array includes N×N imagers, each sensor including pixels of $$\frac{M}{N^2}.$$

Each imager in the camera array also has the same aspect ratio as the conventional image sensor being replaced. Table 1 lists example configurations of camera arrays according to the present invention replacing conventional image sensor.

tion with 2×2 imager will require each imager to have 2 Megapixels. Similarly, 8 Megapixel resolution with a 5×5 array will require each imager to have 0.32 Megapixels. In many embodiments, the number of imagers in the array is determined based upon the requirements of a specific application.

A second factor that may constrain the number of imagers is the issue of parallax and occlusion. With respect to an object captured in an image, the portion of the background scene that is occluded from the view of the imager can be referred to as the "occlusion set." When two imagers capture the object from two different locations, the occlusion set of each imager is different. Hence, there may be scene pixels captured by one imager but not the other. To resolve this issue of occlusion, it is desirable to include a certain minimal set of imagers for a given type of imager and to distribute the imagers symmetrically around the central axis of the camera array.

A third factor that may put a lower bound on the number of imagers is the issue of sensitivity in low light conditions. To improve low light sensitivity, imagers for detecting near-IR spectrum may be needed. The number of imagers in the camera array may need to be increased to accommodate such near-IR imagers.

A fourth factor in determining the size of the imager is dynamic range. To provide dynamic range in the camera array, it is advantageous to provide several imagers of the same filter type (chroma or luma). Each imager of the same filter type may then be operated with different exposures simultaneously. The images captured with different exposures may be processed to generate a high dynamic range image.

Based on these factors, the preferred number of imagers is 2×2 to 6×6. 4×4 and 5×5 configurations are more preferable than 2×2 and 3×3 configurations because the former are likely to provide sufficient number of imagers to resolve occlusion issues, increase sensitivity and increase the dynamic range. In addition, rectangular arrays can also be preferred. At the same time, the computational load required to recover resolution

TABLE 1

| Conventional Image Sensor | | Camera array Including Imagers | | | | | |
|---|---|---|---|---|---|---|---|
| Total Mpixels | Effective Resolution | Total Mpixels | No. of Horizontal Imagers | No. of Vertical Imagers | Imager Mpixels | Super-Resolution Factor | Effective Resolution |
| 8 | 3.2 | 8 | 5 | 5 | 0.32 | 3.2 | 3.2 |
|  |  | 8 | 4 | 4 | 0.50 | 2.6 | 3.2 |
|  |  | 8 | 3 | 3 | 0.89 | 1.9 | 3.2 |
| 5 | 2.0 | 5 | 5 | 5 | 0.20 | 3.2 | 2.0 |
|  |  | 5 | 4 | 4 | 0.31 | 2.6 | 2.0 |
|  |  | 5 | 3 | 3 | 0.56 | 1.9 | 2.0 |
| 3 | 1.2 | 3 | 5 | 5 | 0.12 | 3.2 | 1.2 |
|  |  | 3 | 4 | 4 | 0.19 | 2.6 | 1.2 |
|  |  | 3 | 3 | 3 | 0.33 | 1.9 | 1.2 |

The Super-Resolution Factors in Table 1 are estimates and the Effective Resolution values may differ based on the actual Super-Resolution factors achieved by processing.

The number of imagers in the camera array may be determined based on, among other factors, (i) resolution, (ii) parallax, (iii) sensitivity, and (iv) dynamic range. A first factor for the size of imager is the resolution. From a resolution point of view, the preferred number of the imagers ranges from 2×2 to 6×6 because an array size of larger than 6×6 is likely to destroy frequency information that cannot be recreated by the super-resolution process. For example, 8 Megapixel resolufrom these array sizes will be modest in comparison to that required in the 6×6 array. Arrays larger than 6×6 may, however, be used to provide additional features such as optical zooming and multispectral imaging. Although only square imagers are described here, as will be discussed in greater detail later, such imagers may have different x- and y-dimensions.

Another consideration is the number of imagers dedicated to luma sampling. By ensuring that the imagers in the array dedicated to near-IR sampling do not reduce the achieved resolution, the information from the near-IR images is added to the resolution captured by the luma imagers. For this purpose, at least 50% of the imagers may be used for sampling the luma and/or near-IR spectra. In one embodiment with 4×4 imagers, 4 imagers samples luma, 4 imagers samples near-IR, and the remaining 8 imagers sample two chroma (Red and Blue). In another embodiment with 5×5 imagers, 9 imagers sample luma, 8 imagers sample near-IR, and the remaining 8 imagers sample two chroma (Red and Blue). Further, the imagers with these filters may be arranged symmetrically within the camera array to address occlusion due to parallax. In a further embodiment with 5×5 imager, 17 imagers sample luma, 4 images sample Red, and 4 imagers sample Blue.

In one embodiment, the imagers in the camera array are spatially separated from each other by a predetermined distance. By increasing the spatial separation, the parallax between the images captured by the imagers may be increased. The increased parallax is advantageous where more accurate distance information is important. Separation between two imagers may also be increased to approximate the separation of a pair of human eyes. By approximating the separation of human eyes, a realistic stereoscopic 3D image may be provided to present the resulting image on an appropriate 3D display device.

In one embodiment, multiple camera arrays are provided at different locations on a device to overcome space constraints. One camera array may be designed to fit within a restricted space while another camera array may be placed in another restricted space of the device. For example, if a total of 20 imagers are required but the available space allows only a camera array of 1×10 imagers to be provided on either side of a device, two camera arrays each including 10 imagers may be placed on available space at both sides of the device. Each camera array may be fabricated on a substrate and be secured to a motherboard or other parts of a device. In addition, such imagers do not have to be homogenous in size, and may have different x- and y-dimensions. The images collected from multiple camera arrays may be processed to generate images of desired resolution and performance.

A design for a single imager may be applied to different camera arrays each including other types of imagers. Other variables in the camera array such as spatial distances, color filters and combination with the same or other sensors may be modified to produce a camera array with differing imaging characteristics. In this way, a diverse mix of camera arrays may be produced while maintaining the benefits from economies of scale.

Wafer Level Optics Integration

In one embodiment, the camera array employs wafer level optics (WLO) technology. Although in many embodiments, similar optical channels can be constructed using any of a variety of techniques including but not limited to injection molding, glass molding, and/or combinations of these techniques with other techniques including WLO techniques. WLO itself is a technology that encompasses a number of processes, including, for example, molding optics (such as arrays of lens modules and arrays of those lens arrays) on glass wafers, stacking of those wafers (including wafers having lenses replicated on either side of the substrate) with appropriate spacers, at either a wafer or die-level, followed by packaging of the optics directly with the imager into a monolithic integrated module.

The WLO procedure may involve, among other procedures, using a diamond-turned mold to create each polymer lens element on a glass substrate. More specifically, the process chain in WLO generally includes producing a diamond turned lens master (both on an individual and array level), then producing a negative mold for replication of that master (also called a stamp or tool), and then finally forming a polymer replica on a glass substrate, which has been structured with appropriate supporting optical elements, such as, for example, apertures, light blocking materials, filters, etc.

Figure 2A:
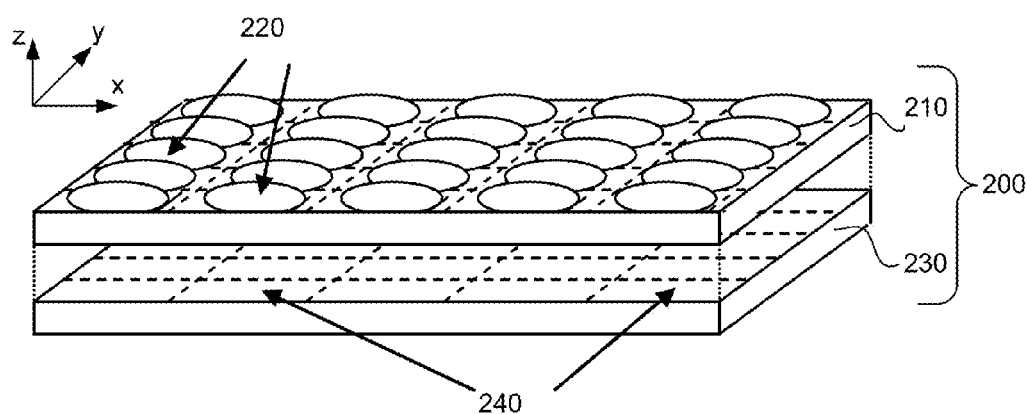
FIG. 2A is a perspective view of a camera array with lens elements, according to one embodiment.
Figure 2B:
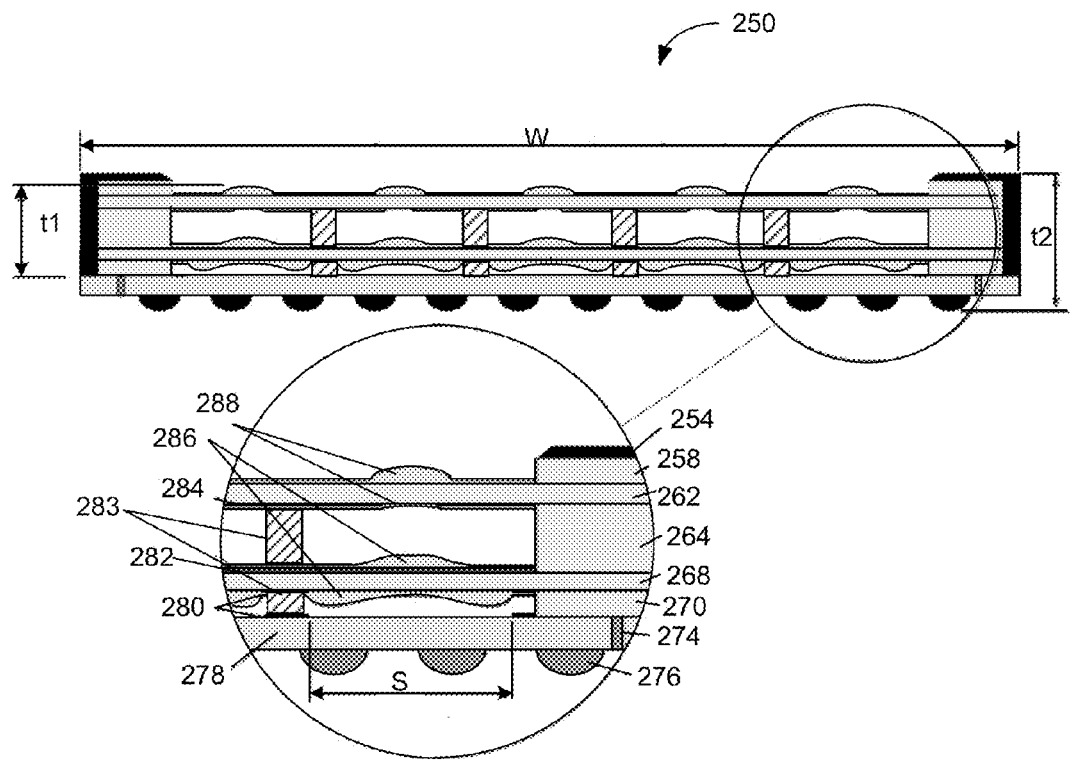
FIG. 2B is a cross-sectional view of a camera array, according to one embodiment.

FIG. 2A is a perspective view of a camera array assembly 200 with wafer level optics 210 and a sensor array 230, according to one embodiment. The wafer level optics 210 includes a plurality of lens elements 220, each lens element 220 covering one of twenty-five imagers 240 in the sensor array 230. Note that the camera array assembly 200 has an array of smaller lens elements occupy much less space compared to a single large lens covering the entire sensor array 230. It should also be noted that each of the lenses may be of a different type. For example, each substrate level may contain lenses that are diffractive, refractive, Fresnel, or a combination thereof. It should be further noted that in the context of the camera array, that a lens element 220 may comprise one or multiple separate optical lens elements axially arranged with respect to each another. Finally, it should be noted that, for most lens materials there will be a thermal induced variance in the refractive index of the material, which must be corrected to obtain good image quality. A temperature normalization procedure will be described in greater detail in the sections to follow. FIG. 2B is a sectional view of a camera array assembly 250, according to one embodiment. The camera assembly 250 includes a top lens wafer 262, a bottom lens wafer 268, a substrate 278 with multiple sensors and associated light sensing elements formed thereon and spacers 258, 264 and 270. The camera array assembly 250 is packaged within an encapsulation 254. An optional top spacer 258 may be placed between the encapsulation 254 and the top lens wafer 262; however, it is not essential to the construction of the camera assembly 250. Optical elements 288 are formed on the top lens wafer 262. Although these optical elements 288 are shown as being identical in FIG. 2B, it should be understood that different types, sizes, and shapes of elements may be used. A middle spacer 264 is placed between the top lens wafer 262 and a bottom lens wafer 268. Another set of optical elements 286 is formed on the bottom lens wafer 268. A bottom spacer 270 is placed between the bottom lens wafer 268 and the substrate 278. Through-silicon vias 274 are also provided to paths for transmitting signal from the imagers. The top lens wafer 262 may be partially coated with light blocking materials 284 (see discussion below) to block of light. The portions of the top lens wafer 262 not coated with the blocking materials 284 serve as aperture stops through which light passes to the bottom lens wafer 268 and the light sensing elements. Although only a single aperture stop is shown in the embodiment provided in FIG. 2B, it should be understood that additional aperture stops may be formed from opaque layers disposed on any and all of the substrate faces in the camera assembly to improve stray light performance and reduced optical crosstalk. A fuller discussion of optical crosstalk suppression is provided below. In addition, although the above embodiment is shown with spacers 258, 264 and 270 the spacer function can also be directly implemented by modifying the lens structures (or substrates) so that the lenses can be directly interconnected. In such an embodiment, the lens height can be extended, and the lens glued directly to the upper substrates thereby eliminating the need for spacer layers.

In the embodiment of FIG. 2B, filters 282 are formed on the bottom lens wafer 268. Light blocking materials 280 may also be coated on the bottom lens 268 to function as an optical isolator. A light blocking material 280 may also be coated on the substrate 278 to protect the sensor electronics from incident radiation. Spacers 283 can also be placed between the bottom lens wafer 268 and the substrate 278 and between the lens wafers 262, 268. In many embodiments, the spacers 283 are similar to the spacers 264 and 270. In a number of embodiments, each layer of spacers is implemented using a single plate. Although not illustrated in FIG. 2B, many embodiments of the invention also include spacers between each optical channel located on top of the top lens wafer 262 that are similar to, or implemented in single layer with, the spacer 258 shown at the edge of the lens stack array. As is discussed further below the spacers can be constructed from and/or coated in light blocking materials to isolate the optical channels formed by the wafer level optics. For the purposes of this application, suitable light blocking materials may include any opaque material, such as, for example, a metal material like Ti and Cr, or an oxide of these materials like black chromium (chrome and chrome oxide), or dark silicon, or a black particle filled photoresist like a black matrix polymer (PSK2000 from Brewer Science). The bottom surface of the substrate is covered with a backside redistribution layer ("RDL") and solder balls 276. In one embodiment, the camera array assembly 250 includes 5×5 array of imagers. The camera array 250 has a width W of 7.2 mm, and a length of 8.6 mm. Each imager in the camera array may have a width S of 1.4 mm. The total height t1 of the optical components is approximately 1.26 mm and the total height t2 the camera array assembly is less than 2 mm. Other heights t1 and t2 are possible for different lens designs.

Optical Crosstalk Suppression

Figure 2C:
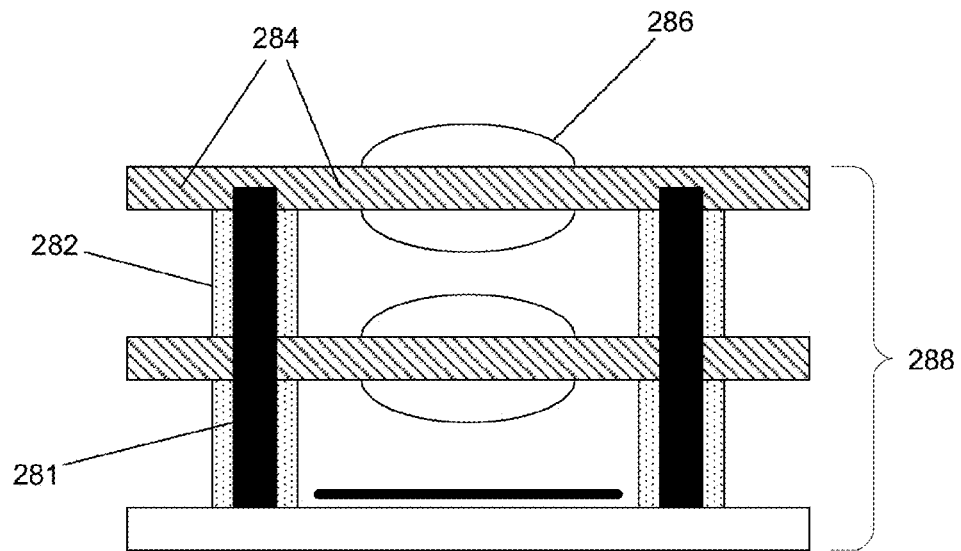
FIG. 2C is a cross-sectional view of a camera array with optical crosstalk suppression, according to one embodiment.

As discussed above, the camera array assembly 250 is composed of multiple imagers, each of which, as shown in FIGS. 2A and 2B, have a corresponding optical pathway or channel that directs light from the scene through the top lens wafer 262, the middle spacer 264, bottom lens wafer 268, the bottom spacer 270 and onto a plurality of light sensing elements that form a sensor 240 disposed on the substrate 278. It is important to final image quality that the light impinging on any particular sensor come only from its designated optical pathway or channel. Optical crosstalk can be considered to occur when light that is incident on the top of one imager is also received by light sensing elements of another imager within the array. Any crosstalk between optical channels from, for example, diffraction and/or scattering of light from elements within the camera, can introduce artifacts in the image data. In particular, crosstalk between optical channels means that an imager will sense the flux from a source on the imager that is inconsistent with the reconstructed position of the image of that detector and the position of the image. This results in both a loss of image data, and the introduction of overlapping noise that cannot be distinguished from real image data. Accordingly, all optical channels of the camera array should be optically isolated so that a ray of light from one lens or optical channel cannot cross from one optical channel to the other. In one embodiment, shown in FIG. 2C, opaque spacers 281 or vertical opaque walls 282 are disposed between each of the optical channels 284. Although opaque spacers do provide a level of optical crosstalk suppression, vertical opaque walls are preferable because in such an embodiment both the space between substrates and the relevant sections of the substrates themselves are rendered non-transparent.

The optical crosstalk suppressing vertical opaque walls may be made using any suitable technique that provides for the introduction of an opaque surface or material between the optical channels 284 of the camera array assembly 286. In one embodiment, the vertical opaque walls are formed by fully or partially introducing grooves into the lens stack 288 of the camera array assembly 286. It is preferable not to cut the grooves fully through the lens stack to preserve the mechanical integrity of the camera array assembly. Such grooves may be introduced by any suitable technique, such as, for example, by dicing into the front or backside of the lens array stack 286 using a wafer dicer (disk/blade), or by laser cutting, or waterjet cutting. Once the grooves are formed, they are filled with a light blocking material. Alternatively, the inner side walls of the grooves may be coated with a light blocking material and the remainder of the groove filled with another material with low shrinkage properties. As discussed above, a light blocking material is any opaque material, such as, for example, a metal material, a metal oxide, dark silicon, or a black particle filled photoresist like a black matrix polymer.

Figure 2D:
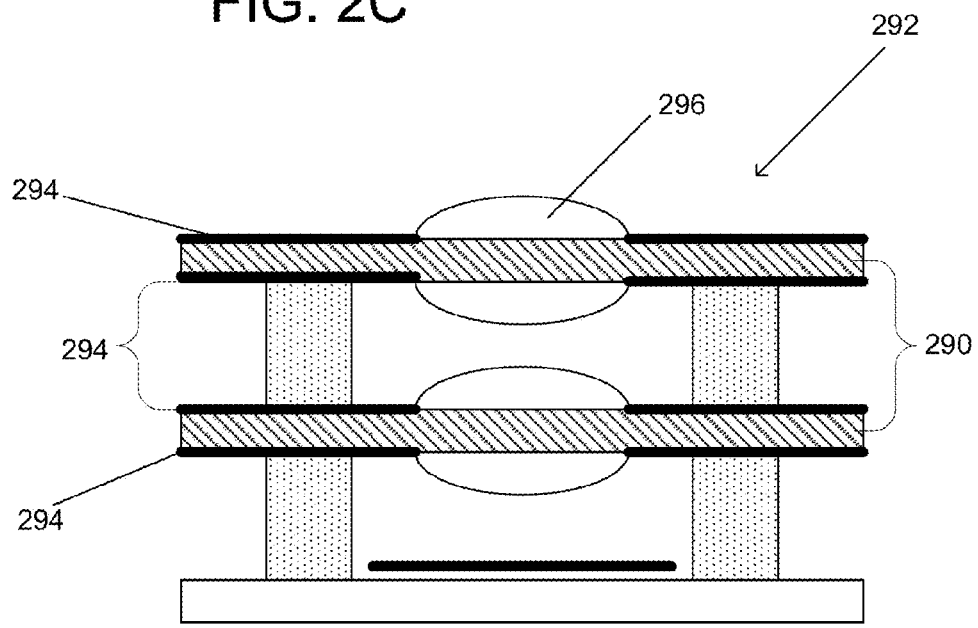
FIG. 2D is a cross-sectional view of a camera array with optical crosstalk suppression, according to a second embodiment.

In another embodiment, shown schematically in FIG. 2D, optical crosstalk suppression is achieved by creating a virtual opaque wall formed by a series of stacked apertures. In this embodiment, a series of aperture stops are formed on the various substrate levels 290 of the camera array assembly 292 by coating the substrates with opaque layers 294 provided with a narrow opening or aperture 296. If enough of these apertures are formed, it is possible to mimic the optical isolation provided by a vertical opaque wall. In such a system, a vertical wall would be the mathematical limit of stacking apertures one on top of each other. Preferably, as many apertures as possible, separated from each other by sufficient space, are provided so that such a virtual opaque wall is created. For any camera array assembly, the number and placement of opaque layers needed to form such a virtual vertical opaque wall can be determined through a ray tracing analysis.

Figure 2E:
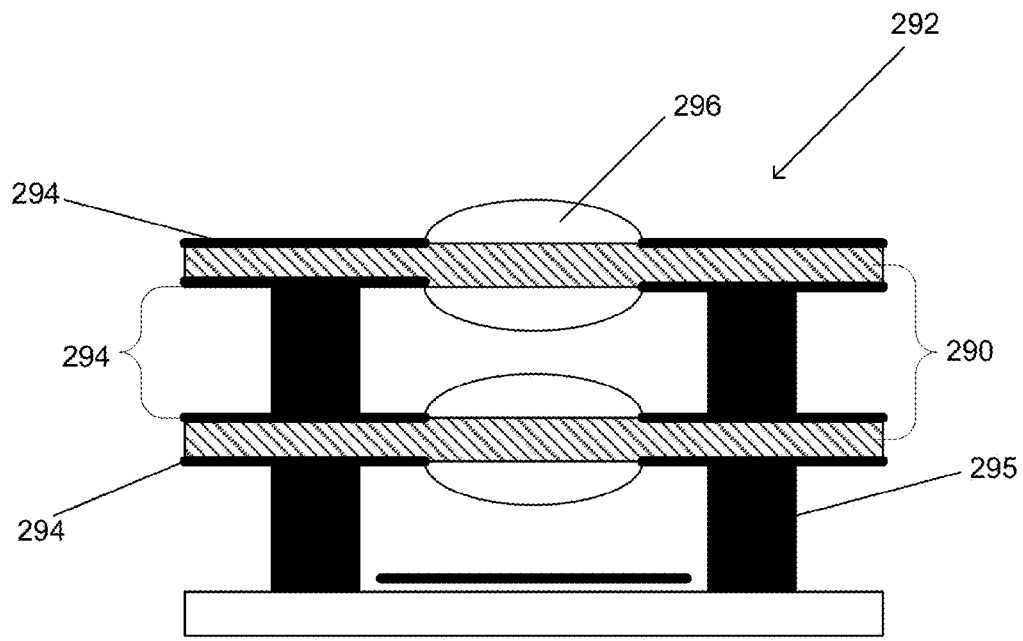
FIG. 2E is a cross-sectional view of a camera array incorporating opaque spacers to provide optical crosstalk suppression, according to a further embodiment.
Figure 2F:
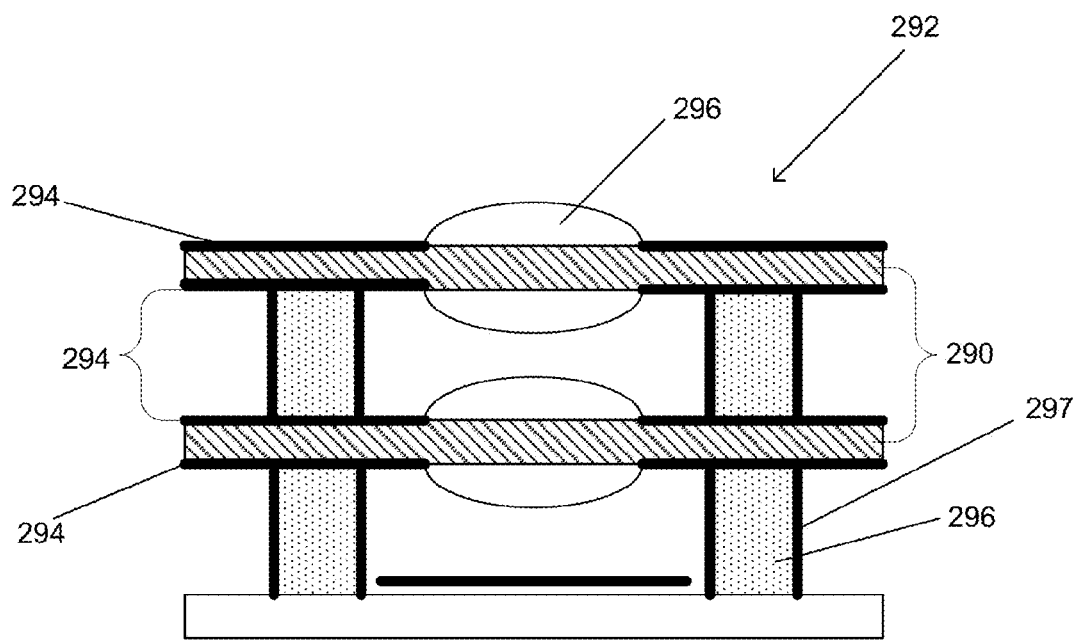
FIG. 2F is a cross-sectional view of a camera array incorporating spacers coated with opaque material to provide crosstalk suppression, according to another embodiment.

In a further embodiment shown schematically in FIG. 2E, optical crosstalk suppression is achieved using spacers 295 constructed from opaque materials. In another further embodiment shown schematically in FIG. 2F, optical crosstalk suppression is achieved using spacers 296 coated with an opaque coating 297. The embodiments illustrated in FIGS. 2E and 2F include stacked apertures 294 similar to the stacked apertures 294 illustrated in FIG. 2D. In several embodiments, optical crosstalk suppression is achieved without using stacked apertures. In many embodiments, any of a variety of light blocking materials can be used in the construction or coating of spacers to achieve optical isolation.

Lens Properties

Figure 3A:
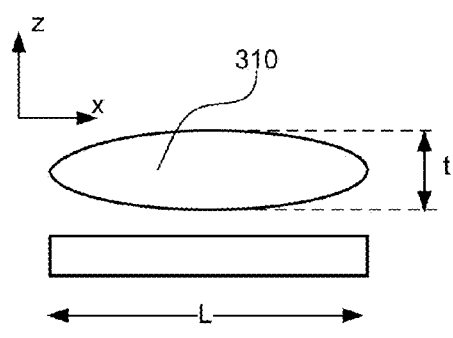
FIGS. 3A and 3B are sectional diagrams illustrating changes in the heights of lens elements depending on changes in the dimensions of imagers, according to one embodiment.
Figure 3B:
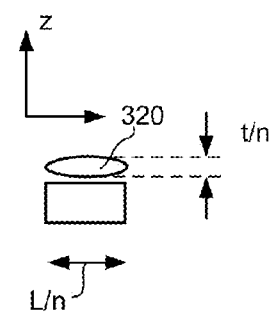

FIGS. 3A and 3B are diagrams illustrating changes in the height t of a lens element pursuant to changes in dimensions in an x-y plane. A lens element 320 in FIG. 3B is scaled by 1/n compared to a lens element 310 in FIG. 3A. Note that during scaling it is important to keep the same F# so image properties don't change. As the diameter L/n of the lens element 320 is smaller than the diameter L by a factor of n, the height t/n of the lens element 320 is also smaller than the height t of the lens element 310 by a factor of n. Hence, by using an array of smaller lens elements, the height of the camera array assembly can be reduced significantly. The reduced height of the camera array assembly may be used to design less aggressive lenses having better optical properties such as improved chief ray angle, reduced distortion, and improved color aberration.

Figure 3C:
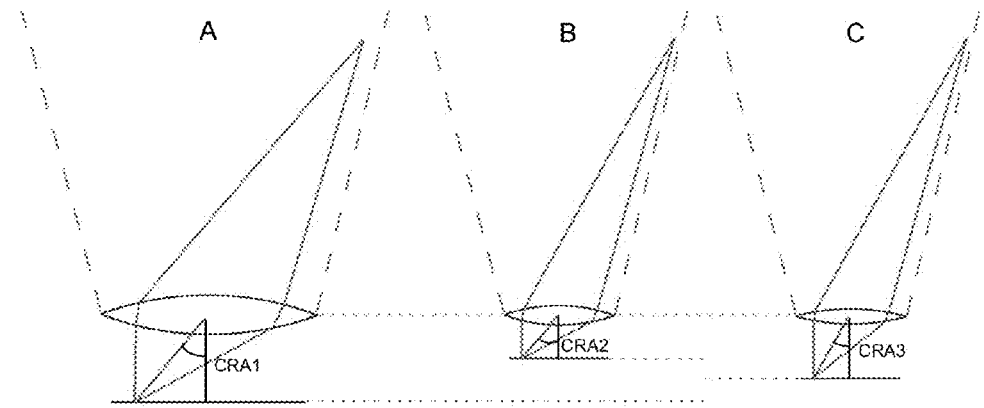
FIG. 3C is a diagram illustrating chief ray angles varying depending on differing dimensions of the lens elements.

FIG. 3C illustrates improving a chief ray angle (CRA) by reducing the thickness of the camera array assembly. CRA1 is the chief ray angle for a single lens covering an entire camera array. Although the chief ray angle can be reduced by increasing the distance between the camera array and the lens, the thickness constraints impose constraints on increasing the distance. Hence, the CRA1 for camera array having a single lens element is large, resulting in reduced optical performance. CRA2 is the chief ray angle for an imager in the camera array that is scaled in thickness as well as other dimensions. The CRA2 remains the same as the CRA1 of the conventional camera array and results in no improvement in the chief ray angle. By modifying the distance between the imager and the lens element as illustrated in FIG. 3C, however, the chief ray angle CRA3 in the camera array assembly may be reduced compared to CRA1 or CRA2, resulting in better optical performance. As described above, the camera arrays according to the present invention has reduced thickness requirements, and therefore, the distance of the lens element and the camera array may be increased to improve the chief ray angle. This relaxed CRA, in turn, results in a lower F# and improved Modulation Transfer Function (MTF).

Figure 3D:
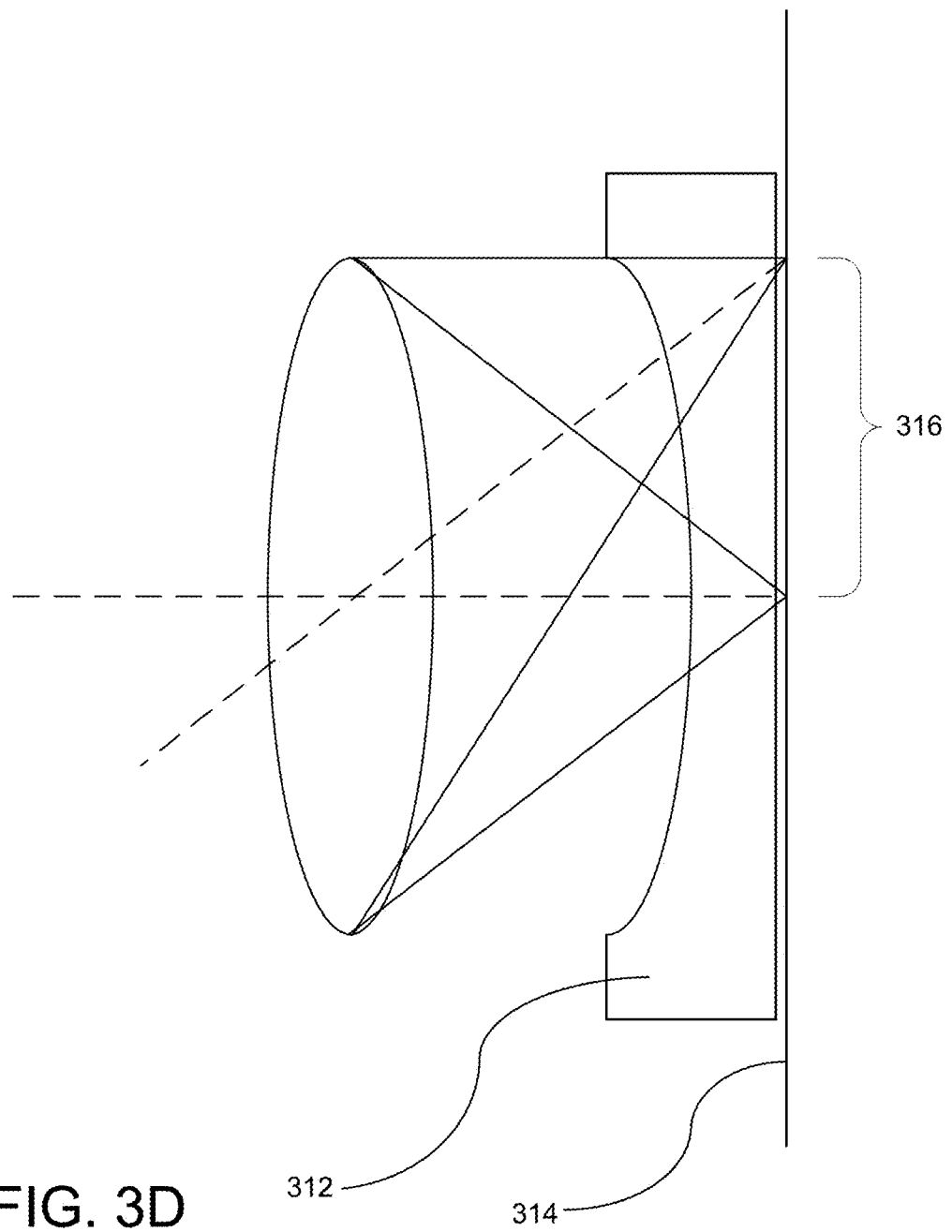
FIG. 3D is a cross-sectional view of a camera array with field flattening, according to one embodiment.

Specifically, one of the issues raised in camera design is how to correct for field curvature. An image projected through a lens is not planar, but has an inherently curved surface. One way to correct this field curvature is to position a thick negative lens element 312 close to or directly on the imager surface 314. The negative lens element planarizes the various angled beams of light 316 from the image, thereby addressing the field curvature problem. Such field flattened images provide superior image performance, allow for the manufacture of array cameras with relaxed TTL requirements, and deliver very homogeneous MTF. However, one problem with this approach is that this field flattening approach intrinsically requires a high CRA. This makes the technique unsuitable for most cameras; however, camera arrays in accordance with embodiments of the invention allow for the use of backside imaging (BSI). Positioning the image sensor behind the substrate relaxes the CRA angle requirement, thereby allowing for the use of the negative lens element field flattening approach shown in FIG. 3D.

Another advantage of the array camera relates to chromatic aberrations. Specifically, in a conventional polychromatic lens, the lens has to be corrected for chromatic aberrations, because the focal length through the lens is different for different wavelengths of light. As a result, it is necessary to compromise the performance of the lens for some of the color wavelengths to get acceptable overall color performance. By making each optical channel narrow spectral band, color aberration is reduced and/or prevented, and each lens may be optimized to a specific color wavelength. For example, an imager receiving visible or near-IR spectrum may have a lens element specifically optimized for this spectral band of light. For imagers detecting other light spectrum, the lens element may be constructed with different properties, such as radii of curvature, so that a constant focal length across all wavelengths of light is achieved so that, in turn, the focal plane is the same for different spectral bands of light. The matching of the focal plane across different wavelengths of light increases the sharpness of image captured at the imager and reduces longitudinal chromatic aberration. Because each lens element may be designed to direct a narrow band of light, the concomitant lack of color aberration means that the lens elements can be subject to less rigorous design constraints, yet produce better or equivalent performance compared to a conventional lens element covering a wide light spectrum. In particular, there is no need to undertake costly aberration balancing correction. What is more, simple lenses generally have better MTF and lower F# (higher sensitivity). It should be noted that although the lenses used in these array cameras have much smaller color aberrations when compared to conventional polychromatic lenses, each lens is still designed to focus a certain wavelength-bandwidth. Accordingly, in one embodiment each of these "monochromatic" lenses can be optimally color corrected by using combinations of high and low Abbe number materials (different optical dispersions).

Light of different wavelengths having different focal lengths (longitudinal color aberration) is not the only type of aberration that occurs in polychromatic optical systems. The refractive index of a lens is dependent on the wavelength of light passing through the lens. As a result, a lens will impart different magnification to colors of different wavelengths. For example, the red wavelength band might have a slightly smaller magnification than green, and green may in turn have a slightly smaller magnification than blue. If the images obtained from these different wavelengths of light are then overlaid without correction, the image will lose resolution because the different colors will not overlap correctly. Based on the properties of the material, the differential lateral distortions of the color magnification can be determined and then corrected. Correction can be accomplished by restricting the profiles of the lenses so that each color has the same magnification, but this reduces the possible degrees of freedom available for lens manufacture, and reduces the ability to optimize MTF. Accordingly, lateral distortion can be permitted optically, and then corrected after imaging computationally. The electronic correction of the lateral color of the lens can actually provide improvements to system performance above and beyond simply correcting for the original distortion, because such correction directly improves the resolution of the system in terms of polychromatic MTF. In particular, lateral color aberrations in a lens can be seen as a color dependent distortion of the lens. By mapping all differently distorted single color images of an object back to the same rectangle, perfect overlap can be achieved in the full color image resulting in the polychromatic MTF being the same as the monochromatic one (not only due to the individual color channel color-blur correction, but also as a result of the exact superposition of the different colors).

Yet another advantage to using many lenses, each optimized for use with a narrow band of light, is that the there is no restriction on the type of lens that may be used. In particular, the array camera allows for the use of diffractive, refractive, Fresnel lenses, or combinations of these types of lenses. Diffractive lenses are attractive because they allow for the creation of complex wavefronts with an essentially flat optical element, and they are also relatively simple to manufacture. In conventional cameras it is not possible to use diffractive lenses because having a single imager means that the lens must be able to efficiently transmit a wide spectrum of light, and while diffractive lenses are very efficient at transmitting narrow wavelength bands of light, there is a steep drop-off in performance for wavelengths of light outside of this optimized range. Because each array of the current camera may be focused on a narrow wavelength of light, the narrow optimized wavelength band of these diffractive lenses is not a limiting factor.

Other advantages of smaller lens elements include, among others, reduced cost, reduced amount of materials, and the reduction in the manufacturing steps. By providing $n^2$ lenses that are 1/n the size in x and y dimension (and thus 1/n thickness), the wafer size for producing the lens element may also be reduced. This reduces the cost and the amount of materials considerably. Further, the number of lens substrates is reduced, which results in a reduced number of manufacturing steps and reduced attendant yield costs. The placement accuracy required to register the lens array to the imagers is typically no more stringent than in the case of a conventional imager because the pixel size for the camera array according to the present invention may be substantially the same as a conventional image sensor. In addition, monochromatic aberrations scale with lens diameter. Because array cameras are able to use smaller lenses, any aberrations that exist are smaller so it is possible to use lenses with simpler profiles. This results in a system that is simultaneously better and less costly to fabricate. Smaller sized lenses also have a lower volume, which results in lower sag or shrinkage during manufacture. Shrinkage is bad for replication because it deforms the desired lens profile, and results in the need for the fabricator to precompensate for the predicted level of sag so that the final lens shape will be correct. This precompensation is difficult to control. With lower sag/shrinkage it is not necessary to have these tight fabrication controls, again lowering the overall cost of the manufacture of the lenses.

In one embodiment, the WLO fabrication process includes: (i) incorporating lens element stops by plating the lens element stops onto the substrate before lens molding, and (ii) etching holes in the substrate and performing two-sided molding of lenses through the substrate. The etching of holes in the substrate is advantageous because index mismatch is not caused between plastic and substrate. In this way, light absorbing substrate that forms natural stops for all lens elements (similar to painting lens edges black) may be used. In one embodiment, filters are part of the imager. In another embodiment, filters are part of a WLO subsystem. In an embodiment including a filter, it is preferred to dispose the filter (whether CFA, IR and/or VIS) into or close to the aperture stop surface and not at the imager sensor surface, because when positioned at a distance from the imager sensor small defects in those filter layers are averaged out over all entrance pupil positions, and are therefore less visible.

Imaging System and Processing Pipeline

Figure 4:
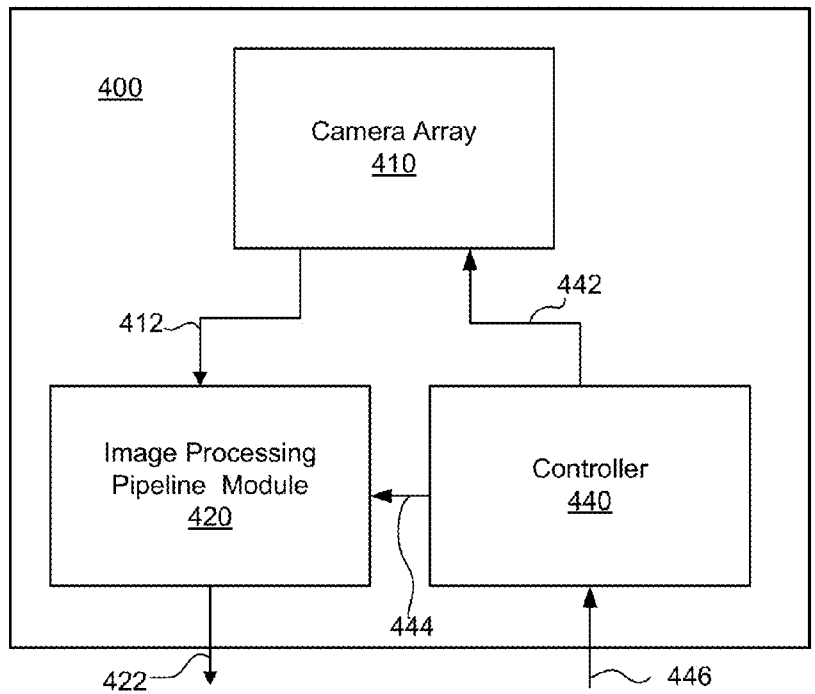
FIG. 4 is a functional block diagram for an imaging device, according to one embodiment.

FIG. 4 is a functional block diagram illustrating an imaging system 400, according to one embodiment. The imaging system 400 may include, among other components, the camera array 410, an image processing pipeline module 420 and a controller 440. The camera array 410 includes two or more imagers, as described above in detail with reference to FIGS. 1 and 2. Images 412 are captured by the two or more imagers in the camera array 410.

The controller 440 is hardware, software, firmware or a combination thereof for controlling various operation parameters of the camera array 410. The controller 440 receives inputs 446 from a user or other external components and sends operation signals 442 to control the camera array 410. The controller 440 may also send information 444 to the image processing pipeline module 420 to assist processing of the images 412.

The image processing pipeline module 420 is hardware, firmware, software or a combination for processing the images received from the camera array 410. The image processing pipeline module 420 processes multiple images 412, for example, as described below in detail with reference to FIG. 5. The processed image 422 is then sent for display, storage, transmittal or further processing.

Figure 5:
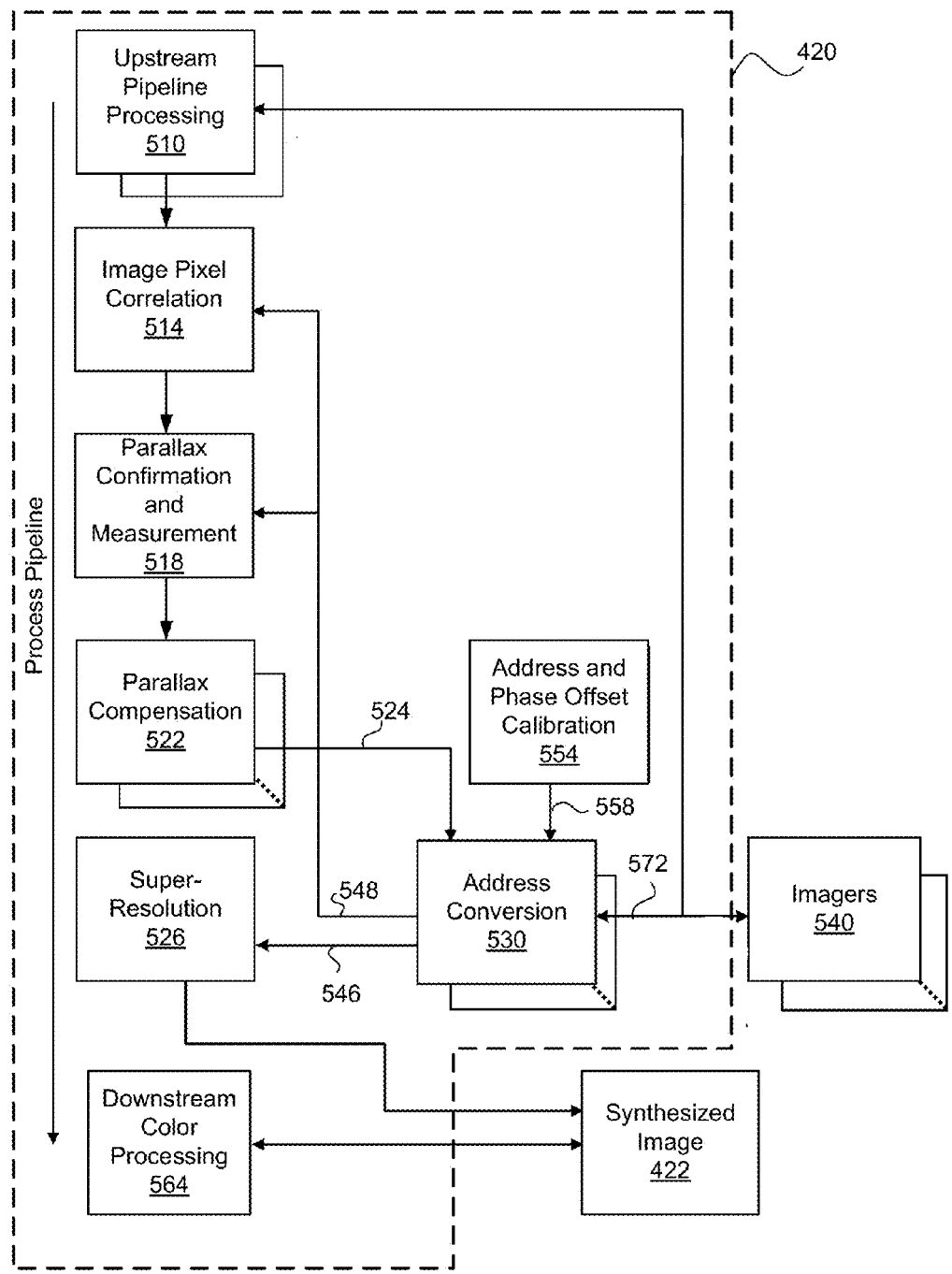
FIG. 5 is a functional block diagram of an image processing pipeline module, according to one embodiment.

FIG. 5 is a functional block diagram illustrating the image processing pipeline module 420, according to one embodiment. The image processing pipeline module 420 may include, among other components, an upstream pipeline processing module 510, an image pixel correlation module 514, a parallax confirmation and measurement module 518, a parallax compensation module 522, a super-resolution module 526, an address conversion module 530, an address and phase offset calibration module 554, and a downstream color processing module 564.

The address and phase offset calibration module 554 is a storage device for storing calibration data produced during camera array characterization in the manufacturing process or a subsequent recalibration process. In several embodiments, the calibration data can indicate mapping between the addresses of physical pixels 572 in the imagers and the logical addresses 546, 548 of an image. In other embodiments, a variety of calibration data appropriate to a specific application can be utilized in the address and phase offset calibration module.

The address conversion module 530 performs normalization based on the calibration data stored in the address and phase offset calibration module 554. Specifically, the address conversion module 530 converts "physical" addresses of the individual pixels in the image to "logical" addresses 548 of the individual pixels in the imagers or vice versa. In order for super-resolution processing to produce an image of enhanced resolution, the phase difference between corresponding pixels in the individual imagers needs to be resolved. The super-resolution process may assume that for each pixel in the resulting image the set of input pixels from each of the imager is consistently mapped and that the phase offset of the image captured by each imager is already known with respect to the position of the pixel in the resulting image. Alternatively, the pixel offsets can be estimated prior to the superresolution process. The address conversion module 530 resolves such phase differences by converting the physical addresses in the images 412 into logical addresses 548 of the resulting image for subsequent processing.

The images 412 captured by the imagers 540 are provided to the upstream pipeline processing module 510. The upstream pipe processing module 510 may perform one or more of normalization of the color planes, Black Level calculation and adjustments, fixed noise compensation, optical PSF (point spread function) deconvolution, noise reduction, lateral color correction and crosstalk reduction.

In one embodiment, the upstream pipeline processing module also performs temperature normalization. Temperature normalization corrects for changes in the refractive index of the optical components through which the imagers receive light that result from changes in the temperature of the camera during use. In several embodiments, the temperature normalization process involves determining the temperature of the camera array by measuring the dark current of one or an average of a number of the camera array's imagers. Using this measurement, a refractive index normalization is performed by picking the correct point spread function from temperature calibration data. Different point spread functions may be obtained during a temperature dependent refractive index characterization of the camera during manufacture, and stored in the imaging system for use in the temperature normalization process.

After the image is processed by the upstream pipeline processing module 510, an image pixel correlation module 514 performs calculation to account for parallax that becomes more apparent as objects being captured approach the camera array. Specifically, the image pixel correlation module 514 aligns portions of images captured by different imagers to compensate for the parallax. In one embodiment, the image pixel correlation module 514 compares the difference between the average values of neighboring pixels with a threshold and flags the potential presence of parallax when the difference exceeds the threshold. The threshold may change dynamically as a function of the operating conditions of the camera array. Further, the neighborhood calculations may also be adaptive and reflect the particular operating conditions of the selected imagers.

The image is then processed by the parallax confirmation and measurement module 518 to detect and meter the parallax. In one embodiment, parallax detection is accomplished by a running pixel correlation monitor. This operation takes place in logical pixel space across the imagers with similar integration time conditions. When the scene is at practical infinity, the data from the imagers is highly correlated and subject only to noise-based variations. When an object is close enough to the camera, however, a parallax effect is introduced that changes the correlation between the imagers. Due to the spatial layout of the imagers, the nature of the parallax-induced change is consistent across all imagers. Within the limits of the measurement accuracy, the correlation difference between any pair of imagers dictates the difference between any other pair of imagers and the differences across the other imagers. This redundancy of information enables highly accurate parallax confirmation and measurement by performing the same or similar calculations on other pairs of imagers. If parallax is present in the other pairs, the parallax should occur at roughly the same physical location of the scene taking into account the positions of the imagers. The measurement of the parallax may be accomplished at the same time by keeping track of the various pair-wise measurements and calculating an "actual" parallax difference as a least squares (or similar statistic) fit to the sample data. Other methods for detecting the parallax may include detecting and tracking vertical and horizontal high-frequency image elements from frame-to-frame.

The parallax compensation module 522 processes images including objects close enough to the camera array to induce parallax differences larger than the accuracy of the phase offset information required by super resolution process. The parallax compensation module 522 uses the scan-line based parallax information generated in the parallax detection and measurement module 518 to further adjust mapping between physical pixel addresses and logical pixel addresses before the super-resolution process. There are two cases that occur during this processing. In a more common case, addressing and offsetting adjustment are required when the input pixels have shifted positions relative to the image-wise-corresponding pixels in other imagers. In this case, no further processing with respect to parallax is required before performing super-resolution. In a less common case, a pixel or group of pixels are shifted in such a way that exposes the occlusion set. In this case, the parallax compensation process generates tagged pixel data indicating that the pixels of the occlusion set should not be considered in the super-resolution process.

After the parallax change has been accurately determined for a particular imager, the parallax information 524 is sent to the address conversion module 530. The address conversion module 530 uses the parallax information 524 along with the calibration data 558 from the address and phase offset calibration module 554 to determine the appropriate X and Y offsets to be applied to logical pixel address calculations. The address conversion module 530 also determines the associated sub-pixel offset for a particular imager pixel with respect to pixels in the resulting image 428 produced by the super-resolution process. The address conversion module 530 takes into account the parallax information 524 and provides logical addresses 546 accounting for the parallax.

After performing the parallax compensation, the image is processed by the super-resolution module 526 to obtain a high resolution synthesized image 422 from low resolution images, as described below in detail. The synthesized image 422 may then be fed to the downstream color processing module 564 to perform one or more of the following operations: focus recover, white balance, color correction, gamma correction, RGB to YUV correction, edge-aware sharpening, contrast enhancement and compression.

The image processing pipeline module 420 may include components for additional processing of the image. For example, the image processing pipeline module 420 may include a correction module for correcting abnormalities in images caused by a single pixel defect or a cluster of pixel defects. The correction module may be embodied on the same chip as the camera array, as a component separate from the camera array or as a part of the super-resolution module 526.

Super-Resolution Processing

In one embodiment, the super-resolution module 526 generates a higher resolution synthesized image by processing low resolution images captured by the imagers 540. The overall image quality of the synthesized image is higher than images captured from any one of the imagers individually. In other words, the individual imagers operate synergistically, each contributing to higher quality images using their ability to capture a narrow part of the spectrum without sub-sampling. The image formation associated with the super-resolution techniques may be expressed as follows:

$$y_k = W_k \cdot x + n_k, \forall k=1 \ldots p \quad \text{equation (2)}$$

where $W_k$ represents the contribution of the HR scene (x) (via blurring, motion, and sub-sampling) to each of the LR images ($y_k$) captured on each of the k imagers and $n_k$ is the noise contribution.

Imager Configurations

Figure 6A:
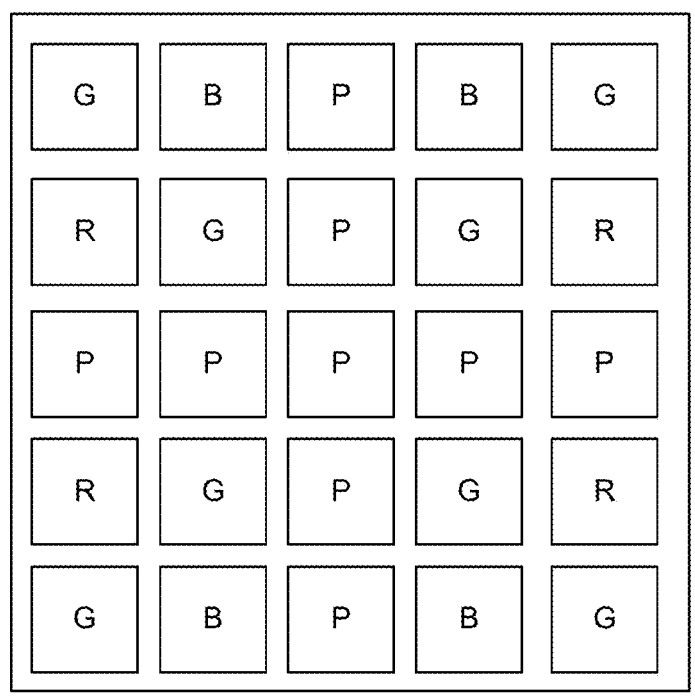
FIGS. 6A through 6F are plan views of camera arrays having different layouts of heterogeneous imagers, according to embodiments.

FIGS. 6A through 6F illustrate various configurations of imagers for obtaining a high resolution image through a super-resolution process, according to embodiments of the present invention. In FIGS. 6A through 6F, "R" represents an imager having a red filter, "G" represents a imager having a green filter, "B" represents an imager having a blue filter, "P" represents a polychromatic imager having sensitivity across the entire visible spectra and near-IR spectrum, and "I" represents an imager having a near-IR filter. The polychromatic imager may sample image from all parts of the visible spectra and the near-IR region (i.e., from 650 nm to 800 nm). In the embodiment of FIG. 6A, the center columns and rows of the imagers include polychromatic imagers. The remaining areas of the camera array are filled with imagers having green filters, blue filters, and red filters. The embodiment of FIG. 6A does not include any imagers for detecting near-IR spectrum alone.

Figure 6B:
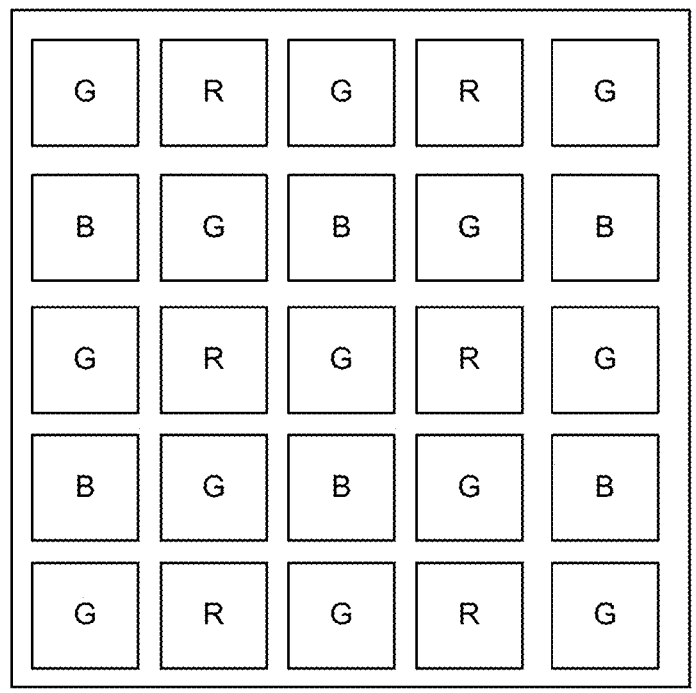

The embodiment of FIG. 6B has a configuration similar to conventional Bayer filter mapping. This embodiment does not include any polychromatic imagers or near-IR imagers. As described above in detail with reference to FIG. 1, the embodiment of FIG. 6B is different from conventional Bayer filter configuration in that each color filter is mapped to each imager instead of being mapped to an individual pixel.

Figure 6C:
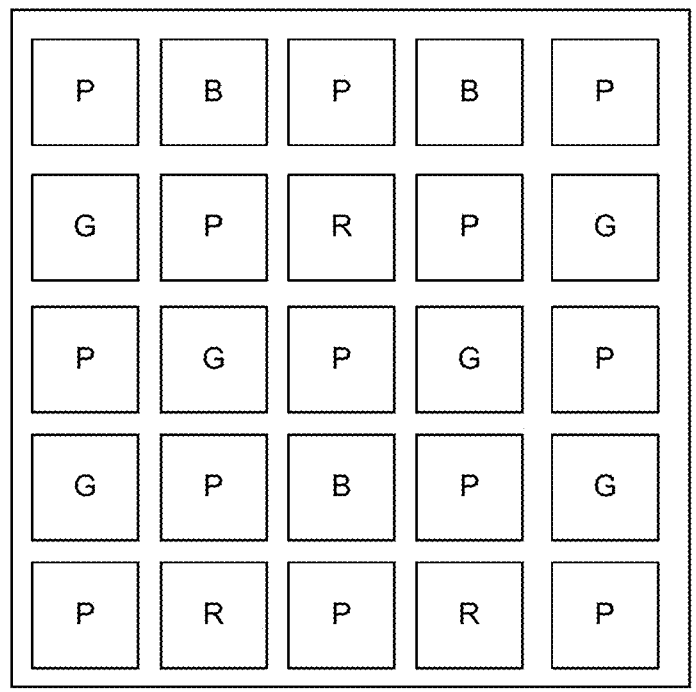
Figure 6D:
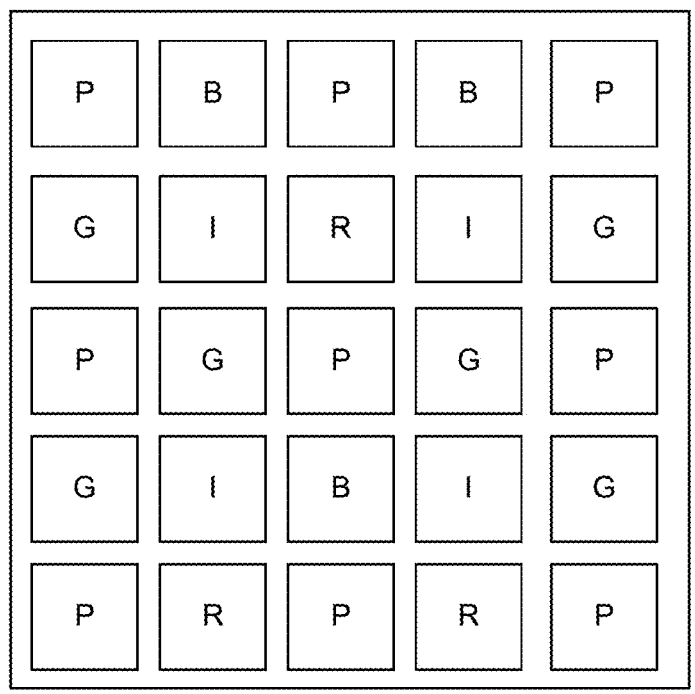
Figure 6E:
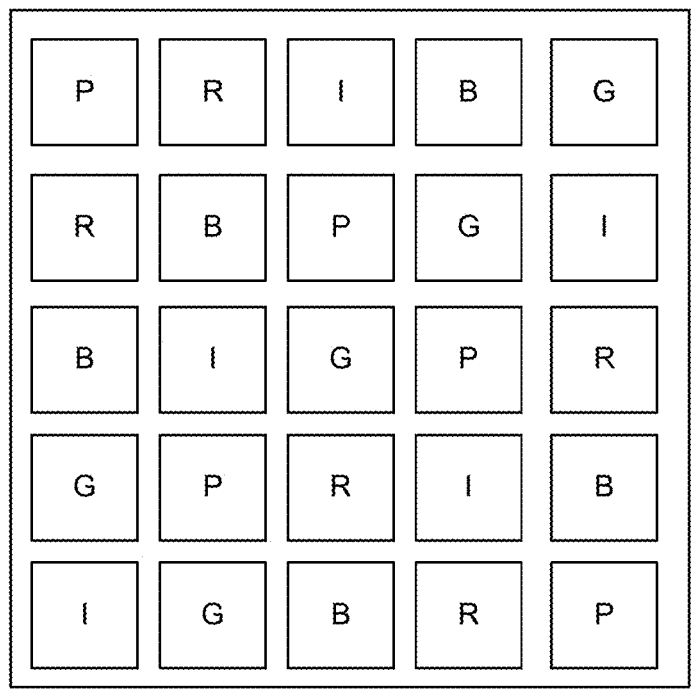
Figure 6F:
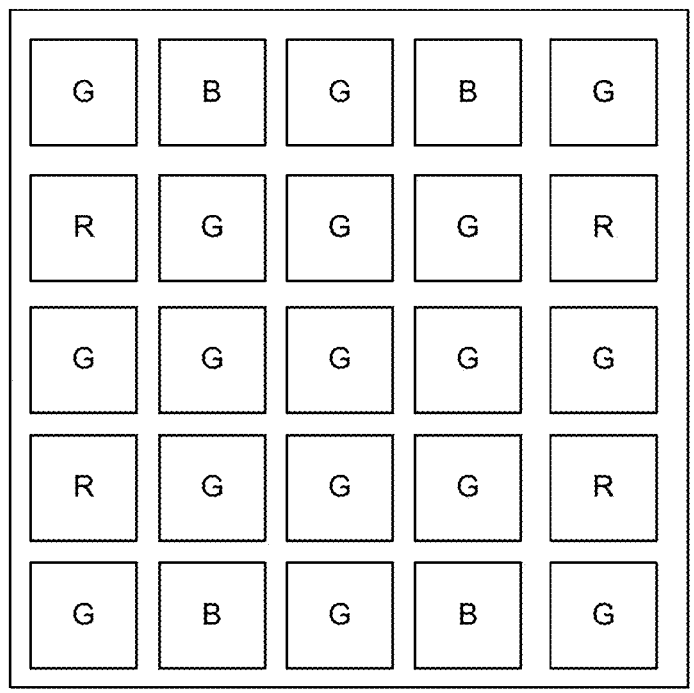

FIG. 6C illustrates an embodiment where the polychromatic imagers form a symmetric checkerboard pattern. FIG. 6D illustrates an embodiment where four near-IR imagers are provided. FIG. 6E illustrates an embodiment with irregular mapping of imagers. FIG. 6F illustrates an embodiment where a 5×5 sensor array is organized into 17 imagers having green filters, four imagers having red filters, and four imagers having blue filters. The sensors are distributed symmetrically around the central axis of the imaging array. As is discussed further below, distributing the imagers in this way prevents pixels that can be imaged by a sensor from being occluded from sensors capturing other wavelengths of light. The embodiments of FIGS. 6A through 6F are merely illustrative and various other layouts of imagers can also be used.

The use of polychromatic imagers and near-IR imagers is advantageous because these sensors may capture high quality images in low lighting conditions. The images captured by the polychromatic imager or the near-IR imager are used to denoise the images obtained from regular color imagers. However, as discussed above, these polychromatic lenses require that an associated color correction technique be used to address color aberrations inherent in a single lens trying to capture all wavelengths of light and deliver it to the same focal plane. Any conventional color correction technique may be utilized with the proposed array cameras.

Imager Layout

The premise of increasing resolution by aggregating multiple low resolution images relies upon the different low resolution images representing slightly different viewpoints of the same scene. If the LR images are all shifted by integer units of a pixel, then each image contains essentially the same information. Therefore, there is no new information in the LR images that can be used to create a HR image. In camera arrays according to embodiments of the invention, the layout of the imagers in the array may be preset and controlled so that each imager in a row or a column captures an image that is shifted a fixed sub-pixel distance relative to the images captured by its neighboring imagers. Ideally, the images captured by each imager are spatially offset from the other imagers in such a way as to provide uniform sampling of the scene or the light field and the uniformity of sampling is such that the LR images captured by each of the imagers yields non-redundant information about the sampled scene (light field). Such non-redundant information about the scene can be utilized by subsequent signal processing processes to synthesize a single HR image.

Figure 6G:
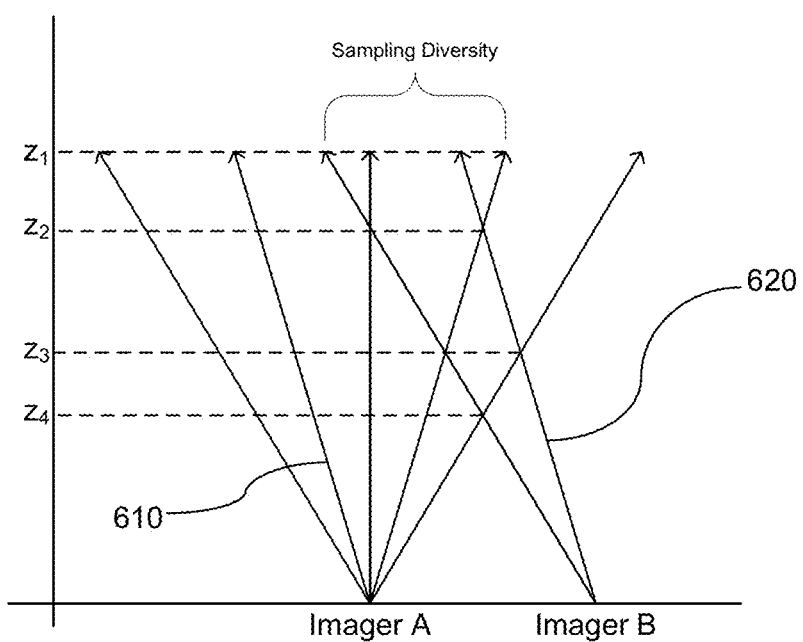
FIG. 6G is a diagram conceptually illustrating the manner in which sampling diversity can depend upon object distance.

A sub-pixel shift between the images captured by two imagers is not, however, sufficient to ensure uniformity of sampling. The uniformity of sampling or sampling diversity of two imagers is a function of object distance. The sampled space by pixels of a pair of imagers is illustrated in FIG. 6G. A first set of rays (610) map to pixels of imager A, while a second set of rays (620) map to pixels of imager B. Conceptually, two adjacent rays from a given imager define the part of the object space that is sampled by a specific pixel in that imager. At distance z1 from the camera plane, there is sufficient sampling diversity since the rays of the pixels of imager A are partially offset from the rays of the pixels of imager B. As the distance decreases there are specific distances (z2, z3, z4) where there is no sampling diversity between imager A and imager B. The lack of sampling diversity between the two imagers quite simply implies that there is no additional information in the scene captured by imager B as compared to that captured by imager A. As is discussed further below, an increased number of imagers in an array camera can mitigate the impact of object distances at which pair of imagers' sample space fully overlap. When a pair of imagers lack sampling diversity, the other imagers in the array provide the necessary sampling diversity to achieve resolution enhancement. Consequently, the ability of an imager system utilizing a 2×2 array of imagers to achieve superresolution is typically more limited than camera systems in accordance with embodiments of the invention that use a larger camera array.

Figure 6H:
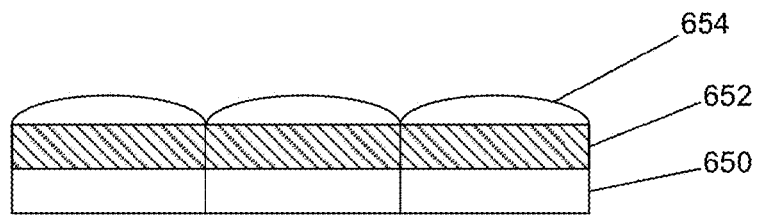
FIG. 6H is a is a cross sectional view of pixels of an imager in accordance with an embodiment of the invention

Referring back to the camera array structures illustrated in FIGS. 2A-2D the wafer level optics includes a plurality of lens elements, where each lens element covers one of the sensors in the array. The physical layout of pixels in a single imager of a camera array in accordance with an embodiment of the invention is illustrated in FIG. 6H. The imager is an array of pixels 650 overlaid with color filters 652 and microlenses 654. The microlenses that sit on top of the color filters are used to focus light on the active area of each underlying pixel. The microlenses can be thought of as sampling the continuous light field in object space sampled by the main lens. Whereas the main lens samples the scene radiance light field, the micro-lenses sample the sensor irradiance light field.

The main lens associated with each imager maps the points in the object space to points in the image space such at that the mapping is bijective (onto-to-one and onto). Each microlens samples a finite extent of the sensor irradiance light field. The sensor irradiance light field is continuous and is the result of a bijective mapping from the object space. Thus, the microlens sampling of a finite extent of the sensor irradiance light field is also a sampling of a corresponding finite extent of the scene radiance light field in object space.

Moving the microlens by a small amount δ laterally along the plain of the imager pixels changes the sampled object space at a certain distance $z_k$ by a correspondingly appropriate factor δ. With an n×n (n>2) array camera, we can choose a baseline microlens shift can be determined by the main lens profile (for example, the chief ray angle) for a baseline imager. For each of the other imagers that sample the same wavelength as the baseline imager, the microlenses of each of the pixels in the imager are shifted by a sub-pixel amount to sample a different part of the scene radiance light field. Thus for a set of imagers arranged in an n×n grid, the sub-pixel shift for a imager that images the same wavelengths as the baseline imager (1,1) at a grid location (i,j) (1≦i, j≦n) is governed by ($δ_x$, $δ_y$) where, $$\frac{(i-1)}{n} \times pixelsize < δ_x \le \frac{i}{n} \times pixelsize$$

$$\frac{(j-1)}{n} \times pixelsize < δ_y \le \frac{j}{n} \times pixelsize$$

Many camera arrays in accordance with embodiments of the invention include significantly more Green imagers than Red and Blue imagers. For example, the array camera illustrated in FIG. 6F includes 17 Green imagers, 4 Red imagers, and 4 Blue imagers. For the purpose of calculating the sub-pixel shifts, the Green imagers can be treated as an n×n grid. Whereas the Red imagers and the Blue imagers can each be treated as a 2×2 grid for the purpose of calculating the sub-pixel shifts.

The sub-pixel shifts discussed above are determined relative to a baseline imager located at the corner of the grid, many embodiments of the invention utilize radial sub-pixel shifts from a baseline imager located at the center of the sensor array. In several embodiments, the radial sub-pixel shifts are chosen so the sub-pixel shifts are evenly distributed to enable the greatest sampling diversity.

The constraints on microlens sub-pixel shifts defined above achieve the highest increases in diversity and can enable the greatest increases in resolution through superresolution processing. Sub-pixel shifts that do not satisfy the constraints, but still provide an increase in sampling diversity can also be used to enable some increase in resolution through superresolution processing. Therefore, embodiments of the invention are not limited to microlens shifts that result in the greatest increases in diversity and in many instances utilize a variety of different microlens shift configurations that provide at least some increase in sampling diversity and that are satisfactory for the requirements of a specific application.

Symmetry of Imager Placement in Camera Array

An issue of separating the spectral sensing elements into different imagers is parallax caused by the physical separation of the imagers. By ensuring that the imagers are symmetrically placed, at least two imagers can capture the pixels around the edge of a foreground object. In this way, the pixels around the edge of a foreground object may be aggregated to increase resolution as well as avoiding any occlusions. In the absence of a symmetrical distribution, a pixel around the edge of a foreground object that is visible to a first imager, for example a Red imager, may be occluded to a second imager that captures different wavelengths, for example a blue imager. Accordingly, color information for the pixel cannot be accurately reconstructed. By symmetrically distributing the sensors, the likelihood that a foreground object will occlude pixels is significantly reduced.

Figure 6I:
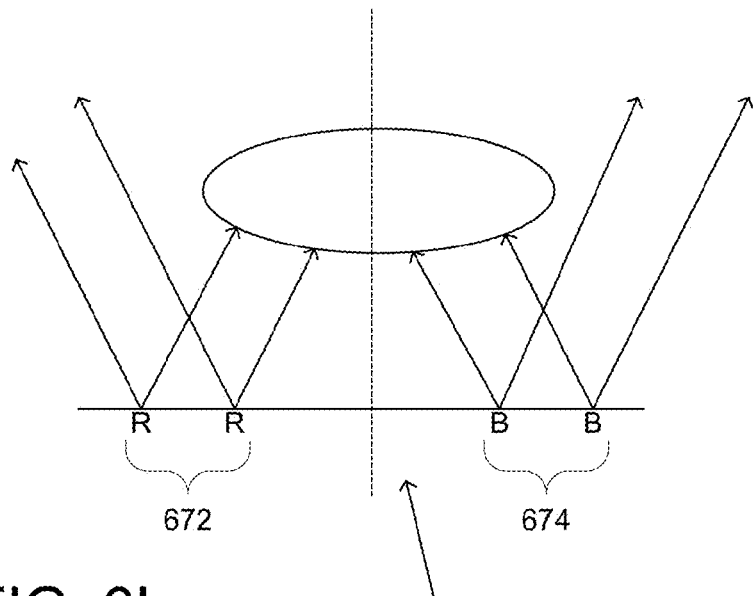
FIG. 6I is a diagram conceptually illustrating occlusion zones created when Red and Blue imagers are not symmetrically distributed about the central access of a camera array.

Pixel occlusion caused by an asymmetric distribution of Red and Blue imagers in a simple array is illustrated in FIG. 6I. A pair of Red imagers 672 is located on the left hand side of the camera array 670 and a pair of Blue imagers 674 is located on the right hand side of the camera array. A foreground object 676 is present and the Red imagers 672 are capable of imaging regions beyond the foreground object on the left hand side of the foreground object. However, the foreground object occludes the Red imagers from imaging these regions. Therefore, the array camera is incapable of reconstructing color information for these regions.

Figure 6J:
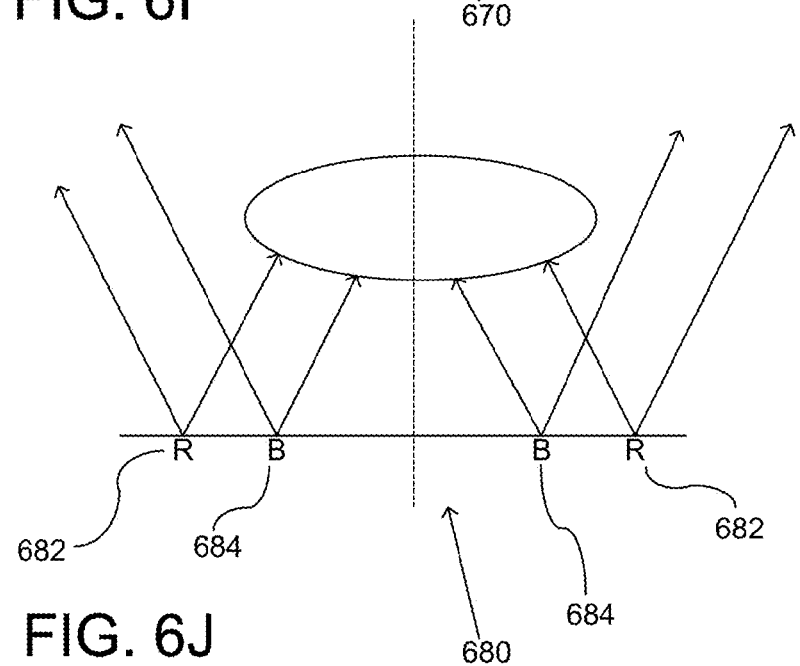
FIG. 6J is a diagram conceptually illustrating the manner in which the occlusion zones illustrated in FIG. 6I are eliminated by distributing Red and Blue imagers symmetrically about the central access of a camera array.

An array that includes a symmetric distribution of Red and Blue imagers in accordance with an embodiment of the invention is illustrated in FIG. 6J. The camera array 780 includes a pair of Red imagers 782 symmetrically distributed around the central axis of the camera array and a pair of Blue imagers 784 symmetrically distributed around the central axis of the camera array. Due to the even distribution, a Red imager and a Blue imager are both able to image beyond the foreground object 786 on the left hand side of the foreground object and a Red imager and a Blue imager are both able to image beyond the foreground object on the right hand side of the foreground object.

The symmetrical arrangement of the simple embodiment illustrated in FIG. 6J can be generalized to array cameras including Red, Green, Blue imagers and/or additional polychromatic or near-IR cameras. By distributing each of the different types of imagers symmetrically around the central axis of the camera array, the effects of parallax introduced by foreground objects can be significantly reduced and color artifacts that would otherwise be introduced, avoided.

The effects of parallax on the sampling of color can also be reduced by using parallax information in polychromatic imagers to improve the accuracy of the sampling of color from the color filtered imagers.

Use of Near-IR Imagers to Obtain Improved High Resolution Images

In one embodiment, near-IR imagers are used to determine relative luminance differences compared to a visible spectra imager. Objects have differing material reflectivity results in differences in the images captured by the visible spectra and the near-IR spectra. At low lighting conditions, the near-IR imager exhibits a higher signal to noise ratios. Therefore, the signals from the near-IR sensor may be used to enhance the luminance image. The transferring of details from the near-IR image to the luminance image may be performed before aggregating spectral images from different imagers through the super-resolution process. In this way, edge information about the scene may be improved to construct edge-preserving images that can be used effectively in the super-resolution process. The advantage of using near-IR imagers is apparent from equation (2) where any improvement in the estimate for the noise (i.e., n) leads to a better estimate of the original HR scene (x).

Generation of High Resolution Images

Figure 7:
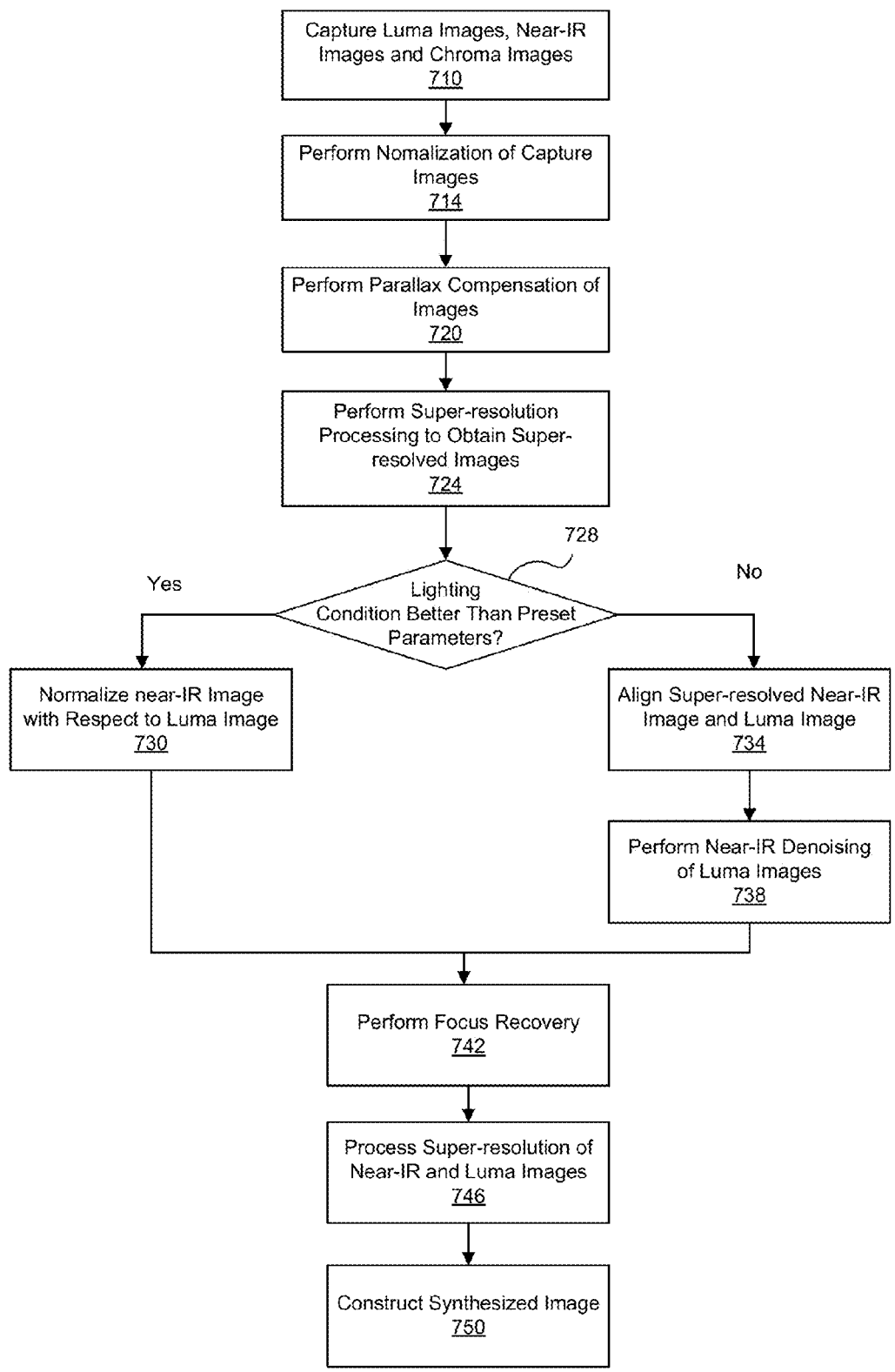
FIG. 7 is a flowchart illustrating a process of generating an enhanced image from lower resolution images captured by a plurality of imagers, according to one embodiment.

FIG. 7 is a flowchart illustrating a process of generating an HR image from LR images captured by a plurality of imagers, according to one embodiment. First, luma images, near-IR images and chroma images are captured 710 by imagers in the camera array. Then normalization is performed 714 on the captured images. The images can be normalized in a variety of ways including but not limited to normalizing the color planes of the images, performing temperature compensation, and mapping physical addresses of the imagers to logical addresses in the enhanced image. In other embodiments, a variety of normalization process appropriate to the specific imagers and imaging applications. Parallax compensation is then performed 720 to resolve any differences in the field-of-views of the imagers due to spatial separations between the imagers. Super-resolution processing is then performed 724 to obtain super-resolved luma images, super-resolved near-IR images, and super-resolved chroma images.

Then it is determined 728 if the lighting condition is better than a preset parameter. If the lighting condition is better than the parameter, the process proceeds to normalize 730 a super-resolved near-IR image with respect to a super-resolved luma image. A focus recovery is then performed 742. In one embodiment, the focus recovery is performed 742 using PSF (point spread function) deblurring per each color channel. Then the super-resolution is processed 746 based on near-IR images and the luma images. A synthesized image is then constructed 750.

If it is determined 728 that the lighting condition is not better than the preset parameter, the super-resolved near-IR images and luma images are aligned 734. Then the super-resolved luma images are denoised 738 using the near-IR super-resolved images. Then the process proceeds to performing focus recovery 742 and repeats the same process as when the lighting condition is better than the preset parameter. Then the process terminates.

Normalization of Color Planes

The relative response of each of the Red, Green, Blue imagers across the imaging planes varies. The variance can be the result of many factors including the optical alignment of the lens and asymmetrical sensor light path geometry. For a given lens and imager, the variance can be compensated for by calibration and normalization. Without compensation, the variance can give rise to artifacts such as color shading.

A process for normalizing a imager with respect to a baseline imager, which is typically a Green imager located in the center of the camera array, in accordance with an embodiment of the invention is discussed below with reference to the normalization of a Red imager with respect to a baseline Green imager. A similar process can be used to normalize Blue imagers with respect to a baseline Green imager. In many embodiments, the process is applied to normalize each Red and Blue imager in a camera array.

A normalization surface can be calibrated by first capturing a scene with flat reflectance, and calculating a color ratio surface to serve as the basis for normalization. An ideal normalization surface is uniform and can be described as:

$$\text{Color Ratio } G/R = G(i,j)/R(i,j) = K = G_{center}/R_{center}$$

where (i,j) describe the pixel position, K is a constant, and $G_{center}$, and $R_{center}$, describe the pixel value at the center position.

The output pixel values of the calibration scene contain the ideal pixel values plus noise plus black level offset, and can be described as follows:

$$SR(i,j) = R(i,j) + \text{Noise } R(i,j) + \text{black offset}$$

$$SG(i,j) = G(i,j) + \text{Noise } G(i,j) + \text{black offset}$$

where SR, and SG are the output pixel values from each imager.

Figure 7A:
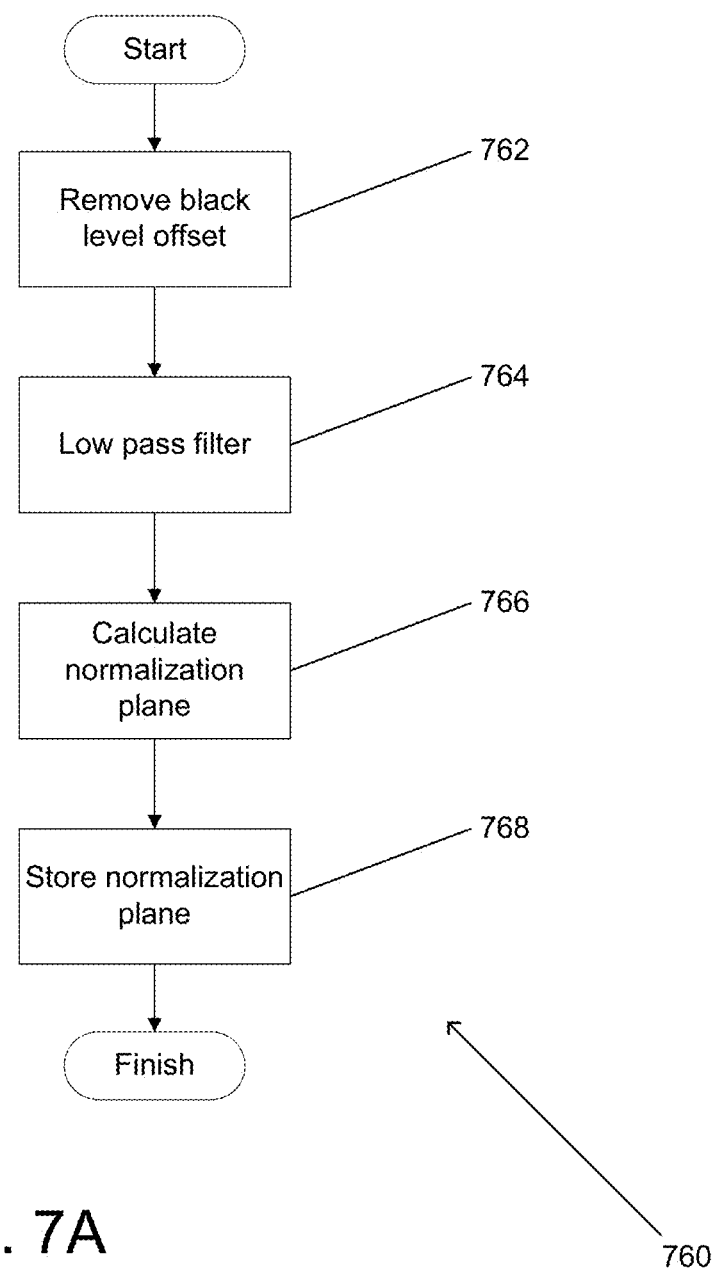
FIG. 7A seems to be a flowchart is a flow chart illustrating a process for constructing a normalization plane during calibration in accordance with an embodiment of the invention.

A process for calibrating the sensor in accordance with an embodiment of the invention is illustrated in FIG. 7A. The process 760 includes removing (762) the black level offset from the sensor pixel values, and low pass filtering (764) the image planes to reduce noise. The normalization plane is calculated (766) and several embodiments are calculated as follows:

Norm $R = G(i,j)/(R(i,j) \times (G_{center}/R_{center}))$ where $G_{center}$, and $R_{center}$, are the pixel values at the center position.

Following the calculation of the normalization plane, an averaging filter can be applied (768) and the values of the Norm R plane are stored (770).

The cost of carrying all of the normalization data for each of the sensors in a sensor array can be quite high. Therefore, many embodiments scan the Norm R plane using a space filling curve to form a one dimensional array. The resultant one dimensional array can be modeled in a variety of different ways including being modeled as a polynomial with suitable order. In several embodiments, the polynomials of the fitted polynomial are stored (810) as parameters that are used during calibration to reconstruct the two dimensional normalization plane. The construction of a space filling curve in accordance with several embodiments of the invention is discussed further below.

Figure 7B:
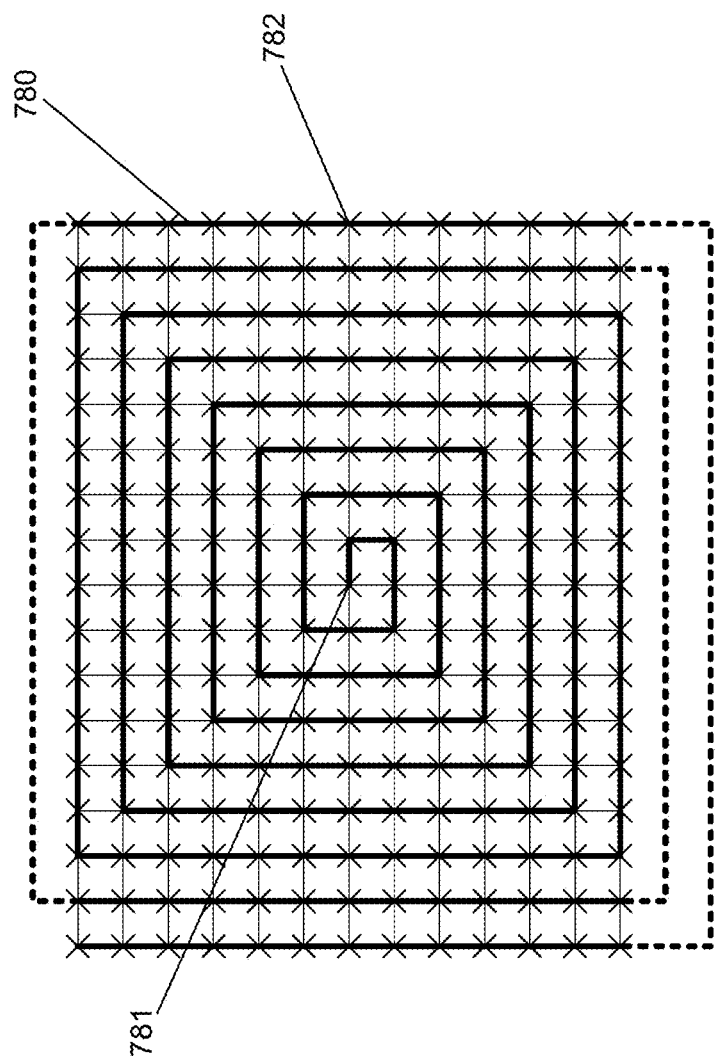
FIG. 7B conceptually illustrates the process for constructing a normalized plane during calibration in accordance with an embodiment of the invention illustrated in FIG. 7A.

In several embodiments, a space filling curve is used to form a one dimensional array describing a normalization plane. A space filling curve, which is constructed using a spiral scan, is illustrated in FIG. 7B. A space filling curve 780 can be constructed by starting at the center of the normalization plane 781 and traversing a four sided square outwards. Each side of the square expands by two pixels compared to the previous square such that every pixel will be traversed exactly once. In the illustrated embodiment, each position 782 which is marked with an 'X' corresponds to a valid pixel position. The imager may not have a square geometry, so the scan path may traverse empty space (indicated as dashed lines). For each position traversed, if it is a valid pixel position, a new data entry is added to the one dimensional data array. Otherwise, the traversing continues without adding a new value to the data array. In many embodiments, the one dimensional data array can be efficiently approximated using a $6^{th}$ order polynomial that can be represented using the seven coefficients of the polynomial. Given that calibration data is typically required for each Red and Blue imager, expressing the normalization planes as coefficients of a polynomial represents a significant reduction in storage requirements. In many embodiments, higher or lower order polynomials, other functions, and/or other compressed representations are utilized to represent the normalization plane in accordance with the requirements of a specific application.

The data value along each side exhibits a fixed geometric relationship. The optical path to the focal point of the lens is shorter for the cells near the center line. The base sensitivity can be thought of as a one dimensional center cut of the calibration surface and approximated by a low order polynomial. The sensitivity polynomial can be either stored as a machine constant (i.e., common to all devices with the same design), or stored along with the scan polynomial to provide additional flexibility. Accordingly, many embodiments of the invention adjust the pixel value based upon the distance factor as follows. For each side scan, one of the coordinates will be a constant, i.e., constant 'y' for horizontal scan and constant 'x' for vertical scan. For each pixel in the side scan, the sensitivity factor is adjusted towards the constant 'x' or 'y' distance.

By way of example, for a horizontal scan the base value can be found by evaluating the sensitivity polynomial based on the distance 'y' from the center. In many embodiments, a suitable polynomial is a fourth order polynomial. Although other polynomials and/or other functions can be utilized in accordance with the requirements of a specific application. For each pixel in the scan path, the distance from the surface origin is used to find the corresponding sensitivity from the polynomial in the same manner. The pixel value is multiplied by an adjustment factor and then stored in the scanned data array. This adjustment factor is calculated by dividing the base value with the current sensitivity value. For the vertical scan a similar method can be applied. Although the example uses a polynomial based sensitivity adjustment, other sensitivity functions and/or adjustments can be utilized depending upon the requirements of a specific application in accordance with various embodiments of the invention.

Once calibration data has been obtained for an imager, the calibration data can be used in the normalization of pixel information captured by the imager. The process typically involves retrieving the stored calibration data, removing the black offset from the captured image and multiplying the resultant values with the normalization plane. When the normalization plane is expressed as a polynomial in the manner outlined above, the polynomial is used to generate a one-dimensional array and an inverse scan of the one-dimensional array is used to form the two dimensional normalization plane. Where a sensitivity adjustment was applied during calibration, an adjustment factor is calculated that is the reciprocal of the adjustment factor applied during the calibration scan and the adjustment factor is applied to the values in the one dimensional array during the inverse scan. When other space filling curves, representations of the resulting one dimensional data array, and/or sensitivity adjustments are performed during the calibration process, the normalization process is adjusted accordingly.

As can be readily appreciated, calibration and normalization processes in accordance with embodiments of the invention can be applied to each of the Red and Blue imagers in the camera array. In many embodiments, a Green imager located in the center of the camera array is used when performing the calibration. In other embodiments, a different Green imager and/or multiple Green imagers can be utilized in the calibration of the Red and Blue imagers in the camera array.

Image Fusion of Color Images with Near-IR Images

The spectral response of CMOS imagers is typically very good in the near-IR regions covering 650 nm to 800 nm and reasonably good between 800 nm and 1000 nm. Although near-IR images having no chroma information, information in this spectral region is useful in low lighting conditions because the near-IR images are relatively free of noise. Hence, the near-IR images may be used to denoise color images under the low lighting conditions.

In one embodiment, an image from a near-IR imager is fused with another image from a visible light imager. Before proceeding with the fusion, a registration is performed between the near-IR image and the visible light image to resolve differences in viewpoints. The registration process may be performed in an offline, one-time, processing step. After the registration is performed, the luminance information on the near-IR image is interpolated to grid points that correspond to each grid point on the visible light image.

After the pixel correspondence between the near-IR image and the visible light image is established, a denoising and detail transfer process may be performed. The denoising process allows transfer of signal information from the near-IR image to the visible light image to improve the overall SNR of the fusion image. The detail transfer ensures that edges in the near-IR image and the visible light image are preserved and accentuated to improve the overall visibility of objects in the fused image.

In one embodiment, a near-IR flash may serve as a near-IR light source during capturing of an image by the near-IR imagers. Using the near-IR flash is advantageous, among other reasons, because (i) the harsh lighting on objects of interest may be prevented, (ii) ambient color of the object may be preserved, and (iii) red-eye effect may be prevented.

In one embodiment, a visible light filter that allows only near-IR rays to pass through is used to further optimize the optics for near-IR imaging. The visible light filter improves the near-IR optics transfer function because the light filter results in sharper details in the near-IR image. The details may then be transferred to the visible light images using a dual bilateral filter as described, for example, in Eric P. Bennett et al., "Multispectral Video Fusion," Computer Graphics (ACM SIGGRAPH Proceedings) (Jul. 25, 2006), which is incorporated by reference herein in its entirety.

Dynamic Range Determination by Differing Exposures at Imagers

An auto-exposure (AE) algorithm is important to obtaining an appropriate exposure for the scene to be captured. The design of the AE algorithm affects the dynamic range of captured images. The AE algorithm determines an exposure value that allows the acquired image to fall in the linear region of the camera array's sensitivity range. The linear region is preferred because a good signal-to-noise ratio is obtained in this region. If the exposure is too low, the picture becomes under-saturated while if the exposure is too high the picture becomes over-saturated. In conventional cameras, an iterative process is taken to reduce the difference between measured picture brightness and previously defined brightness below a threshold. This iterative process requires a large amount of time for convergence, and sometimes results in an unacceptable shutter delay.

In one embodiment, the picture brightness of images captured by a plurality of imagers is independently measured. Specifically, a plurality of imagers are set to capturing images with different exposures to reduce the time for computing the adequate exposure. For example, in a camera array with 5×5 imagers where 8 luma imagers and 9 near-IR imagers are provided, each of the imagers may be set with different exposures. The near-IR imagers are used to capture low-light aspects of the scene and the luma imagers are used to capture the high illumination aspects of the scene. This results in a total of 17 possible exposures. If exposure for each imager is offset from an adjacent imager by a factor of 2, for example, a maximum dynamic range of $2^{17}$ or 102 dB can be captured. This maximum dynamic range is considerably higher than the typical 48 dB attainable in a conventional camera with 8 bit image outputs.

At each time instant, the responses (under-exposed, over-exposed or optimal) from each of the multiple imagers are analyzed based on how many exposures are needed at the subsequent time instant. The ability to query multiple exposures simultaneously in the range of possible exposures accelerates the search compared to the case where only one exposure is tested at once. By reducing the processing time for determining the adequate exposure, shutter delays and shot-to-shot lags may be reduced.

In one embodiment, the HDR image is synthesized from multiple exposures by combining the images after linearizing the imager response for each exposure. The images from the imagers may be registered before combining to account for the difference in the viewpoints of the imagers.

In one embodiment, at least one imager includes HDR pixels to generate HDR images. HDR pixels are specialized pixels that capture high dynamic range scenes. Although HDR pixels show superior performances compared to other pixels, HDR pixels show poor performance at low lighting conditions in comparison with near-IR imagers. To improve performance at low lighting conditions, signals from the near-IR imagers may be used in conjunction with the signal from the HDR imager to attain better quality images across different lighting conditions.

In one embodiment, an HDR image is obtained by processing images captured by multiple imagers by processing, as disclosed, for example, in Paul Debevec et al., "Recovering High Dynamic Range Radiance Maps from Photographs," Computer Graphics (ACM SIGGRAPH Proceedings), (Aug. 16, 1997), which is incorporated by reference herein in its entirety. The ability to capture multiple exposures simultaneously using the imager is advantageous because artifacts caused by motion of objects in the scene can be mitigated or eliminated.

Hyperspectral Imaging by Multiple Imagers

In one embodiment, a multi-spectral image is rendered by multiple imagers to facilitate the segmentation or recognition of objects in a scene. Because the spectral reflectance coefficients vary smoothly in most real world objects, the spectral reflectance coefficients may be estimated by capturing the scene in multiple spectral dimensions using imagers with different color filters and analyzing the captured images using Principal Components Analysis (PCA).

In one embodiment, half of the imagers in the camera array are devoted to sampling in the basic spectral dimensions (R, G, and B) and the other half of the imagers are devoted to sampling in a shifted basic spectral dimensions (R', G', and B'). The shifted basic spectral dimensions are shifted from the basic spectral dimensions by a certain wavelength (e.g., 10 nm).

In one embodiment, pixel correspondence and non-linear interpolation is performed to account for the sub-pixel shifted views of the scene. Then the spectral reflectance coefficients of the scene are synthesized using a set of orthogonal spectral basis functions as disclosed, for example, in J. P. S. Parkkinen, J. Hallikainen and T. Jaaskelainen, "Characteristic Spectra of Munsell Colors," J. Opt. Soc. Am., A 6:318 (August 1989), which is incorporated by reference herein in its entirety. The basis functions are eigenvectors derived by PCA of a correlation matrix and the correlation matrix is derived from a database storing spectral reflectance coefficients measured by, for example, Munsell color chips (a total of 1257) representing the spectral distribution of a wide range of real world materials to reconstruct the spectrum at each point in the scene.

At first glance, capturing different spectral images of the scene through different imagers in the camera array appears to trade resolution for higher dimensional spectral sampling. However, some of the lost resolution may be recovered. The multiple imagers sample the scene over different spectral dimensions where each sampling grid of each imager is offset by a sub-pixel shift from the others. In one embodiment, no two sampling grid of the imager overlap. That is, the superposition of all the sampling grids from all the imagers forms a dense, possibly non-uniform, montage of points. Scattered data interpolation methods may be used to determine the spectral density at each sample point in this non-uniform montage for each spectral image, as described, for example, in Shiaofen Fang et al., "Volume Morphing Methods for Landmark Based 3D Image Deformation" by SPIE vol. 2710, proc. 1996 SPIE Intl Symposium on Medical Imaging, page 404-415, Newport Beach, Calif. (February 1996), which is incorporated by reference herein in its entirety. In this way, a certain amount of resolution lost in the process of sampling the scene using different spectral filters may be recovered.

As described above, image segmentation and object recognition are facilitated by determining the spectral reflectance coefficients of the object. The situation often arises in security applications wherein a network of cameras is used to track an object as it moves from the operational zone of one camera to another. Each zone may have its own unique lighting conditions (fluorescent, incandescent, D65, etc.) that may cause the object to have a different appearance in each image captured by different cameras. If these cameras capture the images in a hyper-spectral mode, all images may be converted to the same illuminant to enhance object recognition performance.

In one embodiment, camera arrays with multiple imagers are used for providing medical diagnostic images. Full spectral digitized images of diagnostic samples contribute to accurate diagnosis because doctors and medical personnel can place higher confidence in the resulting diagnosis. The imagers in the camera arrays may be provided with color filters to provide full spectral data. Such camera array may be installed on cell phones to capture and transmit diagnostic information to remote locations as described, for example, in Andres W. Martinez et al., "Simple Telemedicine for Developing Regions: Camera Phones and Paper-Based Microfluidic Devices for Real-Time, Off-Site Diagnosis," Analytical Chemistry (American Chemical Society) (Apr. 11, 2008), which is incorporated by reference herein in its entirety. Further, the camera arrays including multiple imagers may provide images with a large depth of field to enhance the reliability of image capture of wounds, rashes, and other symptoms.

In one embodiment, a small imager (including, for example, 20-500 pixels) with a narrow spectral bandpass filters is used to produce a signature of the ambient and local light sources in a scene. By using the small imager, the exposure and white balance characteristics may be determined more accurately at a faster speed. The spectral bandpass filters may be ordinary color filters or diffractive elements of a bandpass width adequate to allow the number of camera arrays to cover the visible spectrum of about 400 nm. These imagers may run at a much higher frame rate and obtain data (which may or may not be used for its pictorial content) for processing into information to control the exposure and white balance of other larger imagers in the same camera array. The small imagers may also be interspersed within the camera array.

Optical Zoom Implemented Using Multiple Imagers

In one embodiment, a subset of imagers in the camera array includes telephoto lenses. The subset of imagers may have other imaging characteristics that are the same as imagers with non-telephoto lenses. Images from this subset of imagers are combined and super-resolution processed to form a super-resolution telephoto image. In another embodiment, the camera array includes two or more subsets of imagers equipped with lenses of more than two magnifications to provide differing zoom magnifications.

Embodiments of the camera arrays may achieve its final resolution by aggregating images through super-resolution. Taking an example of providing 5×5 imagers with a 3× optical zoom feature, if 17 imagers are used to sample the luma (G) and 8 imagers are used to sample the chroma (R and B), 17 luma imagers allow a resolution that is four times higher than what is achieved by any single imager in the set of 17 imagers. If the number of the imagers is increased from 5×5 to 6×6, an addition of 11 extra imagers becomes available. In comparison with the 8 Megapixel conventional image sensor fitted with a 3× zoom lens, a resolution that is 60% of the conventional image sensor is achieved when 8 of the additional 11 imagers are dedicated to sampling luma (G) and the remaining 3 imagers are dedicated to chroma (R and B) and near-IR sampling at 3× zoom. This considerably reduces the chroma sampling (or near-IR sampling) to luma sampling ratio. The reduced chroma to luma sampling ratio is somewhat offset by using the super-resolved luma image at 3× zoom as a recognition prior on the chroma (and near-IR) image to resample the chroma image at a higher resolution.

With 6×6 imagers, a resolution equivalent to the resolution of conventional image sensor is achieved at 1× zoom. At 3× zoom, a resolution equivalent to about 60% of conventional image sensor outfitted with a 3× zoom lens is obtained by the same imagers. Also, there is a decrease in luma resolution at 3× zoom compared with conventional image sensors with resolution at 3× zoom. The decreased luma resolution, however, is offset by the fact that the optics of conventional image sensor has reduced efficiency at 3× zoom due to crosstalk and optical aberrations.

The zoom operation achieved by multiple imagers has the following advantages. First, the quality of the achieved zoom is considerably higher than what is achieved in the conventional image sensor due to the fact that the lens elements may be tailored for each change in focal length. In conventional image sensors, optical aberrations and field curvature must be corrected across the whole operating range of the lens, which is considerably harder in a zoom lens with moving elements than in a fixed lens element where only aberrations for a fixed focal length need to be corrected. Additionally, the fixed lens in the imagers has a fixed chief ray angle for a given height, which is not the case with conventional image sensor with a moving zoom lens. Second, the imagers allow simulation of zoom lenses without significantly increasing the optical track height. The reduced height allows implementation of thin modules even for camera arrays with zooming capability.

The overhead required to support a certain level of optical zoom in camera arrays according to some embodiments is tabulated in Table 2.

TABLE 2

| No. of Imagers in Camera array | No. of Luma Imagers at different Zoom levels | | | No. of Chroma Imagers at different Zoom Levels | | |
|---|---|---|---|---|---|---|
| | 1X | 2X | 3X | 1X | 2X | 3X |
| 25 | 17 | 0 | 0 | 8 | 0 | 0 |
| 36 | 16 | 0 | 8 | 8 | 0 | 4 |

In one embodiment, the pixels in the images are mapped onto an output image with a size and resolution corresponding to the amount of zoom desired in order to provide a smooth zoom capability from the widest-angle view to the greatest-magnification view. Assuming that the higher magnification lenses have the same center of view as the lower magnification lenses, the image information available is such that a center area of the image has a higher resolution available than the outer area. In the case of three or more distinct magnifications, nested regions of different resolution may be provided with resolution increasing toward the center.

An image with the most telephoto effect has a resolution determined by the super-resolution ability of the imagers equipped with the telephoto lenses. An image with the widest field of view can be formatted in at least one of two following ways. First, the wide field image may be formatted as an image with a uniform resolution where the resolution is determined by the super-resolution capability of the set of imagers having the wider-angle lenses. Second, the wide field image is formatted as a higher resolution image where the resolution of the central part of the image is determined by the super-resolution capability of the set of imagers equipped with telephoto lenses. In the lower resolution regions, information from the reduced number of pixels per image area is interpolated smoothly across the larger number of "digital" pixels. In such an image, the pixel information may be processed and interpolated so that the transition from higher to lower resolution regions occurs smoothly.

In one embodiment, zooming is achieved by inducing a barrel-like distortion into some, or all, of the array lens so that a disproportionate number of the pixels are dedicated to the central part of each image. In this embodiment, every image has to be processed to remove the barrel distortion. To generate a wide-angle image, pixels closer to the center are sub-sampled relative to outer pixels are super-sampled. As zooming is performed, the pixels at the periphery of the imagers are progressively discarded and the sampling of the pixels nearer the center of the imager is increased.

In one embodiment, mipmap filters are built to allow images to be rendered at a zoom scale that is between the specific zoom range of the optical elements (e.g., 1× and 3× zoom scales of the camera array). Mipmaps are a precalculated optimized set of images that accompany a baseline image. A set of images associated with the 3× zoom luma image can be created from a baseline scale at 3× down to 1×. Each image in this set is a version of the baseline 3× zoom image but at a reduced level of detail. Rendering an image at a desired zoom level is achieved using the mipmap by (i) taking the image at 1× zoom, and computing the coverage of the scene for the desired zoom level (i.e., what pixels in the baseline image needs to be rendered at the requested scale to produce the output image), (ii) for each pixel in the coverage set, determine if the pixel is in the image covered by the 3× zoom luma image, (iii) if the pixel is available in the 3× zoom luma image, then choose the two closest mipmap images and interpolate (using smoothing filter) the corresponding pixels from the two mipmap images to produce the output image, and (iv) if the pixel is unavailable in the 3× zoom luma image, then choose the pixel from the baseline 1× luma image and scale up to the desired scale to produce the output pixel. By using mipmaps, smooth optical zoom may be simulated at any point between two given discrete levels (i.e., 1× zoom and 3× zoom).

Figure 8A:
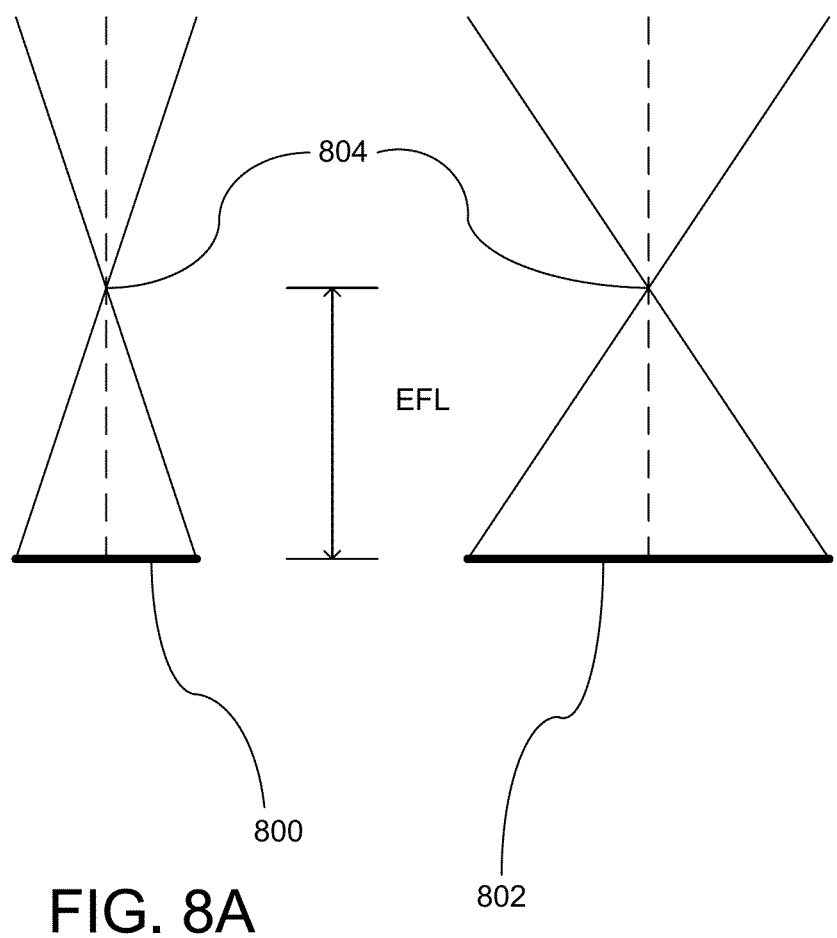
FIG. 8A is a cross-sectional view of a camera array with optical zoom, according to one embodiment.

In one embodiment, zooming is achieved by realizing different Fields Of View (FOV)s by electronically switching between different optical channels having different sensor sizes, but fixed Effective Focal Lengths (EFL)s. In one such embodiment, shown schematically in FIG. 8A, variable FOVs are achieved by creating optical channels on the same substrate that have different imager sizes 800 and 802 at the same fixed EFL 804. Using this structure, it would be possible to create an arbitrary number of zoom magnifications by including image sensors with larger or smaller numbers of pixels. This technique is particularly simple to incorporate into WLO array cameras as these variable zoom sensor arrays 800 and 802 can be fabricated directly onto the base camera array substrate without any further modification to the design of the array camera assembly itself.

Figure 8B:
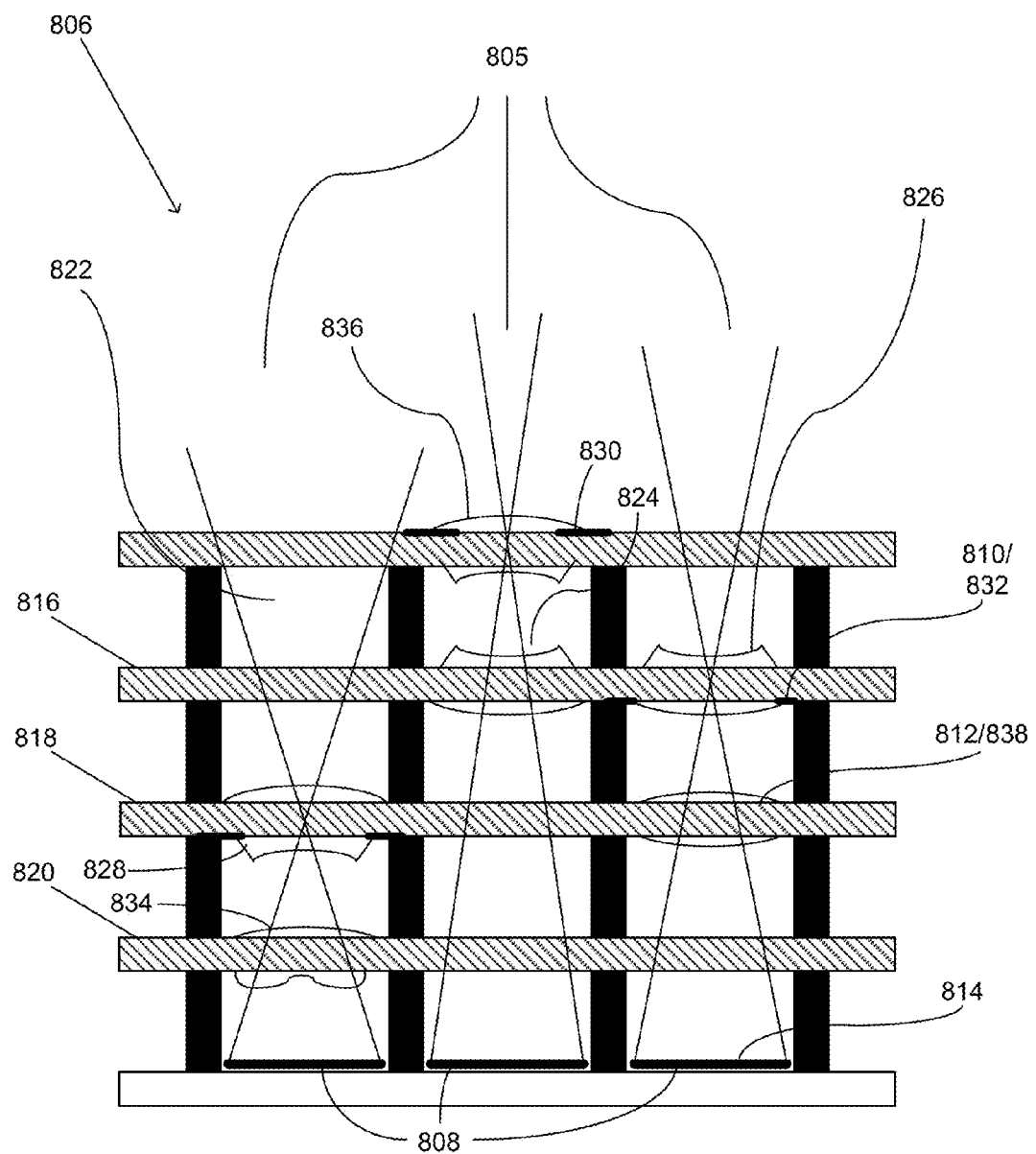
FIG. 8B is a cross-sectional view of a camera array with optical zoom, according to a second embodiment.

In another embodiment, as shown in FIG. 8B, different FOVs are achieved by engineering different EFLs 805 into specific optical channels of the camera array 806 while maintaining a fixed imager size 808. Implementing different EFLs on the same substrate stacks, i.e., substrate stacks with constant thicknesses and spacings, is more complicated, because the distance of the principal plane and with it the entrance pupil and consequently the aperture stop 810 with respect to the image sensor 814 needs to be changed in order to change the focal length of the optical channel. In the current embodiment, this is accomplished by the introduction of "dummy substrates" 816, 818 and 820 into the stack 806, such that each zoom channel 822, 824 and 826 has an associated aperture stop 828, 830 and 832 disposed on a different substrate or a different face of a substrate, such that different EFLs can be achieved. As shown, while the distribution and positioning of the lenses (834, 836 and 838) and the aperture stops (828, 830 and 832) on the particular substrate or substrate face is entirely dependent on the desired EFL, in all cases the substrate thicknesses and distances remain fixed. Alternatively, in such an embodiment, each of the substrates could be provided with lenses, but in different distributions in order to allow for different EFLs. Such a structure would allow for higher image quality, but at higher cost.

Figure 8C:
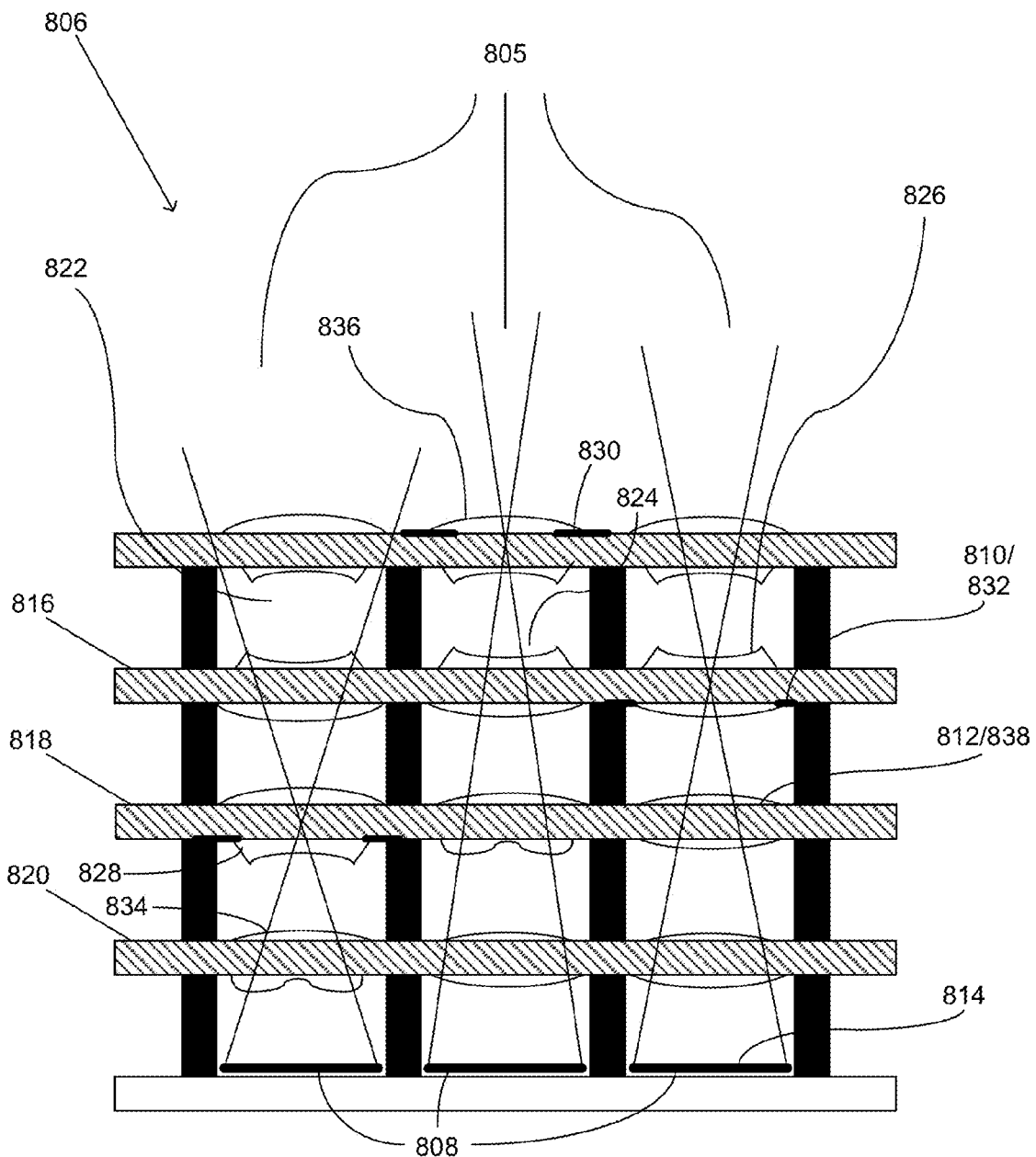
FIG. 8C is a cross-sectional view of a camera array with imagers having different fields-of-view, according to a further embodiment.

In another further embodiment, as shown in FIG. 8C, different FOVs can also be achieved by engineering different EFLs 805 using "dummy" substrates in a manner similar to that illustrated in FIG. 8B, with the exception that all of the substrates have lenses elements on them in each optical channel. The lens elements, however, have different prescriptions in order to allow different EFLs. Accordingly, any of a variety of configurations of optics and sensor size, and/or light sensing element size can be utilized with an array camera in accordance with embodiments of the invention to achieve different FOVs.

Capturing Video Images

In one embodiment, the camera array generates high frame image sequences. The imagers in the camera array can operate independently to capture images. Compared to conventional image sensors, the camera array may capture images at the frame rate up to N time (where N is the number of imagers). Further, the frame period for each imager may overlap to improve operations under low-light conditions. To increase the resolution, a subset of imagers may operate in a synchronized manner to produce images of higher resolution. In this case, the maximum frame rate is reduced by the number of imagers operating in a synchronized manner. The high-speed video frame rates can enables slow-motion video playback at a normal video rate.

In one example, two luma imagers (green imagers or near-IR imagers), two blue imagers and two green imagers are used to obtain high-definition 1080p images. Using permutations of four luma imagers (two green imagers and two near-IR imagers or three green imagers and one near-IR imager) together with one blue imager and one red imager, the chroma imagers can be upsampled to achieve 120 frames/sec for 1080p video. For higher frame rate imaging devices, the number of frame rates can be scaled up linearly. For Standard-Definition (480p) operation, a frame rate of 240 frames/sec may be achieved using the same camera array.

Conventional imaging devices with a high-resolution image sensor (e.g., 8 Megapixels) use binning or skipping to capture lower resolution images (e.g., 1080p30, 720p30 and 480p30). In binning, rows and columns in the captured images are interpolated in the charge, voltage or pixel domains in order to achieve the target video resolutions while reducing the noise. In skipping, rows and columns are skipped in order to reduce the power consumption of the sensor. Both of these techniques result in reduced image quality.

In one embodiment, the imagers in the camera arrays are selectively activated to capture a video image. For example, 9 imagers (including one near-IR imager) may be used to obtain 1080p (1920×1080 pixels) images while 6 imagers (including one near-IR imager) may be used to obtain 720p (1280×720 pixels) images or 4 imagers (including one near-IR imager) may be used to obtain 480p (720×480 pixels) images. Because there is an accurate one-to-one pixel correspondence between the imager and the target video images, the resolution achieved is higher than traditional approaches. Further, since only a subset of the imagers is activated to capture the images, significant power savings can also be achieved. For example, 60% reduction in power consumption is achieved in 1080p and 80% of power consumption is achieved in 480p.

Using the near-IR imager to capture video images is advantageous because the information from the near-IR imager may be used to denoise each video image. In this way, the camera arrays of embodiments exhibit excellent low-light sensitivity and can operate in extremely low-light conditions. In one embodiment, super-resolution processing is performed on images from multiple imagers to obtain higher resolution video imagers. The noise-reduction characteristics of the super-resolution process along with fusion of images from the near-IR imager results in a very low-noise images.

In one embodiment, high-dynamic-range (HDR) video capture is enabled by activating more imagers. For example, in a 5×5 camera array operating in 1080p video capture mode, there are only 9 cameras active. A subset of the 16 cameras may be overexposed and underexposed by a stop in sets of two or four to achieve a video output with a very high dynamic range.

Other Applications for Multiple Imagers

In one embodiment, the multiple imagers are used for estimating distance to an object in a scene. Since information regarding the distance to each point in an image is available in the camera array along with the extent in x and y coordinates of an image element, the size of an image element may be determined. Further, the absolute size and shape of physical items may be measured without other reference information. For example, a picture of a foot can be taken and the resulting information may be used to accurately estimate the size of an appropriate shoe.

In one embodiment, reduction in depth of field is simulated in images captured by the camera array using distance information. The camera arrays according to the present invention produce images with greatly increased depth of field. The long depth of field, however, may not be desirable in some applications. In such case, a particular distance or several distances may be selected as the "in best focus" distance(s) for the image and based on the distance (z) information from parallax information, the image can be blurred pixel-by-pixel using, for example, a simple Gaussian blur. In one embodiment, the depth map obtained from the camera array is utilized to enable a tone mapping algorithm to perform the mapping using the depth information to guide the level, thereby emphasizing or exaggerating the 3D effect.

In one embodiment, apertures of different sizes are provided to obtain aperture diversity. The aperture size has a direct relationship with the depth of field. In miniature cameras, however, the aperture is generally made as large as possible to allow as much light to reach the camera array. Different imagers may receive light through apertures of different sizes. For imagers to produce a large depth of field, the aperture may be reduced whereas other imagers may have large apertures to maximize the light received. By fusing the images from sensor images of different aperture sizes, images with large depth of field may be obtained without sacrificing the quality of the image.

In one embodiment, the camera array according to the present invention refocuses based on images captured from offsets in viewpoints. Unlike a conventional plenoptic camera, the images obtained from the camera array of the present invention do not suffer from the extreme loss of resolution. The camera array according to the present invention, however, produces sparse data points for refocusing compared to the plenoptic camera. In order to overcome the sparse data points, interpolation may be performed to refocus data from the spare data points.

In one embodiment, each imager in the camera array has a different centroid. That is, the optics of each imager are designed and arranged so that the fields of view for each imager slightly overlap but for the most part constitute distinct tiles of a larger field of view. The images from each of the tiles are panoramically stitched together to render a single high-resolution image.

In one embodiment, camera arrays may be formed on separate substrates and mounted on the same motherboard with spatial separation. The lens elements on each imager may be arranged so that the corner of the field of view slightly encompasses a line perpendicular to the substrate. Thus, if four imagers are mounted on the motherboard with each imager rotated 90 degrees with respect to another imager, the fields of view will be four slightly overlapping tiles. This allows a single design of WLO lens array and imager chip to be used to capture different tiles of a panoramic image.

In one embodiment, one or more sets of imagers are arranged to capture images that are stitched to produce panoramic images with overlapping fields of view while another imager or sets of imagers have a field of view that encompasses the tiled image generated. This embodiment provides different effective resolution for imagers with different characteristics. For example, it may be desirable to have more luminance resolution than chrominance resolution. Hence, several sets of imagers may detect luminance with their fields of view panoramically stitched. Fewer imagers may be used to detect chrominance with the field of view encompassing the stitched field of view of the luminance imagers.

In one embodiment, the camera array with multiple imagers is mounted on a flexible motherboard such that the motherboard can be manually bent to change the aspect ratio of the image. For example, a set of imagers can be mounted in a horizontal line on a flexible motherboard so that in the quiescent state of the motherboard, the fields of view of all of the imagers are approximately the same. If there are four imagers, an image with double the resolution of each individual imager is obtained so that details in the subject image that are half the dimension of details that can be resolved by an individual imager. If the motherboard is bent so that it forms part of a vertical cylinder, the imagers point outward. With a partial bend, the width of the subject image is doubled while the detail that can be resolved is reduced because each point in the subject image is in the field of view of two rather than four imagers. At the maximum bend, the subject image is four times wider while the detail that can be resolved in the subject is further reduced.

Offline Reconstruction and Processing

The images processed by the imaging system 400 may be previewed before or concurrently with saving of the image data on a storage medium such as a flash device or a hard disk. In one embodiment, the images or video data includes rich light field data sets and other useful image information that were originally captured by the camera array. Other traditional file formats could also be used. The stored images or video may be played back or transmitted to other devices over various wired or wireless communication methods.

In one embodiment, tools are provided for users by a remote server. The remote server may function both as a repository and an offline processing engine for the images or video. Additionally, applets mashed as part of popular photo-sharing communities such as Flikr, Picasaweb, Facebook etc. may allow images to be manipulated interactively, either individually or collaboratively. Further, software plug-ins into image editing programs may be provided to process images generated by the imaging device 400 on computing devices such as desktops and laptops.

Various modules described herein may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed:

1. A lens stack array configured to form multiple images of a scene, comprising:
    lens elements formed on substrates separated by spacers, where the lens elements, substrates and spacers are configured to form a plurality of optical channels, where the optical channels are configured to form an image of an object space within a scene from slightly different viewpoints so that the images formed by each of the optical channels include a view of the same object space within the scene and contain non-redundant information about the object space;
    at least one aperture located within each optical channel;
    at least one spectral filter located within each optical channel, where each spectral filter is configured to pass a specific spectral band of light;
    light blocking materials located within the lens stack array to optically isolate the optical channels; and
    wherein the shape of at least one lens surface of at least one lens element within at least a first optical channel is a function of a first spectral band of light;
    wherein the shape of at least one lens surface of at least one lens element within at least a second optical channel is also a function of the first spectral band of light; and
    wherein the shape of at least one lens surface of at least one lens element within at least a third optical channel is a function of a second spectral band of light.

2. The lens stack array of claim 1, wherein the light blocking materials are selected from the group consisting of opaque materials, reflective materials and combinations thereof.

3. The lens stack array of claim 1, wherein each spectral filter is selected from the group consisting of an organic color filter, an absorptive material, a dielectric coating, an interference filter, a multilayer coating, and combinations thereof.

4. The lens stack array of claim 1, further comprising at least one polarizing filter located within each optical channel.

5. The lens stack array of claim 1, wherein the radius of curvature of the shape of the at least one lens surface of the at least one lens element within the first optical channel is a function of the first spectral band of light.

6. The lens stack array of claim 1, wherein the shape of the at least one lens surface of the at least one lens element within the first optical channel is rotationally symmetric and aspheric, and is described by an aspheric lens equation, wherein the coefficients of the aspheric lens equation are a function of the first spectral band of light.

7. The lens stack array of claim 1, wherein the back focal length of each of the at least two optical channels in the lens stack array that have a spectral filter is the same irrespective of the spectral band of light passed by the spectral filter within the optical channel.

8. The lens stack array of claim 1, wherein a combination of high and low Abbe number materials is used in the construction of each of the lens elements in an optical channel to reduce chromatic aberrations.

9. The lens stack array of claim 1, further comprising:
    at least one aperture stop located within each optical channel;
    wherein each spectral filter is located within each optical channel so that the spectral filter is proximate the aperture stop.

10. The lens stack array of claim 9, wherein each aperture stop is formed by a light blocking material selected from the group consisting of metal materials, oxide materials, black particle filled photoresists and combinations thereof.

11. The lens stack array of claim 1, wherein:
    at least one lens surface is selected from the group consisting of diffractive, Fresnel, refractive and combinations thereof.

12. The lens stack array of claim 11, wherein the radii of curvature of at least two lens surfaces differ based upon the specific spectral band of light passed by the spectral filter within each of the at least two optical channels that have spectral filters.

13. The lens stack array of claim 11, wherein each of the optical channels have the same back focal length.

14. The lens stack array of claim 1, wherein at least one of the lens elements in an optical channel is a negative lens element, and the negative lens element is proximate the image formed by the optical channel.

15. The lens stack array of claim 1, wherein at least two of the optical channels have different focal lengths.

16. The lens stack array of claim 1, further comprising a mechanical zoom mechanism within an optical channel configured to smoothly transition between different fields of view.

17. The lens stack array of claim 1, wherein the lens stack array comprises an N×M array of optical channels, where at least one of N and M is greater than 2.

18. The lens stack array of claim 1, wherein the lens stack array is fabricated using techniques consisting of wafer level optics techniques, injection molding, glass molding and combinations thereof.

19. The lens stack array of claim 1, wherein the light blocking materials located within the lens stack array to optically separate the optical channels comprise at least two opaque surfaces located on a substrate within an optical channel, where the two opaque surfaces have openings arranged in axial alignment with the optical channel.

20. The lens stack array of claim 1, wherein the light blocking materials located within the lens stack array to optically separate the optical channels comprise opaque walls disposed at the boundaries between the optical channels.

21. The lens stack array of claim 20, wherein the opaque walls are cavities between the optical channels filled with light blocking material.

22. The lens stack array of claim 1, wherein a plurality of the spacers are constructed from light blocking materials and are located within the lens stack array to optically separate the optical channels.

23. The lens stack array of claim 1, wherein a plurality of the spacers are coated in light blocking materials and are located within the lens stack array to optically isolate the optical channels.

24. The lens stack array of claim 1, further comprising at least one spectral filter located within a plurality of the optical channels, where each spectral filter is configured to pass a specific spectral band of light, such that a first spectral filter located in the first optical channel defines the first spectral band of light, and a second spectral filter located in the third optical channel defines the second spectral band of light.

25. The lens stack array of claim 24, further comprising a third spectral filter located in a fourth optical channel that defines a third spectral band of light.

26. The lens stack array of claim 1, wherein the substrates are coated with the light blocking materials so as to define at least two aperture stops within at least a first optical channel and two aperture stops within at least an adjacent second optical channel, such that at least the first optical channel and at least the second optical channel are optically isolated from one another.

27. The lens stack array of claim 1, wherein at least one spectral filter is located within the space defined by the substrates separated by spacers.

28. The lens stack array of claim 27, wherein at least one spectral filter is disposed on the surface of a lens element.

29. The lens stack array of claim 1, wherein at least one spectral filter is disposed external to the space defined by the substrates separated by spacers.

30. The lens stack array of claim 1, wherein the lens stack array is configured to be integrated with a sensor that includes an imager for each optical channel to form a camera module assembly, such that each optical channel focuses light onto one imager, wherein at least one spectral filter within an optical channel is located on the surface of a corresponding imager.

* * * * *